US012686208B2

(12) United States Patent
Hirai et al.

(10) Patent No.: US 12,686,208 B2
(45) Date of Patent: Jul. 21, 2026

(54) LIQUID EJECTING HEAD AND LIQUID EJECTING APPARATUS

(71) Applicant: SEIKO EPSON CORPORATION, Tokyo (JP)

(72) Inventors: Eiju Hirai, Azumino (JP); Motoki Takabe, Shiojiri (JP); Masaki Mori, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 223 days.

(21) Appl. No.: 18/509,716

(22) Filed: Nov. 15, 2023

(65) Prior Publication Data

US 2024/0165950 A1 May 23, 2024

(30) Foreign Application Priority Data

Nov. 18, 2022 (JP) ................................. 2022-184621

(51) Int. Cl.
| | |
|---|---|
| *B41J 2/14* | (2006.01) |
| *B41J 2/045* | (2006.01) |

(Continued)

(52) U.S. Cl.
CPC ....... *B41J 2/14233* (2013.01); *B41J 2/04566* (2013.01); *H10N 30/87* (2023.02);

(Continued)

(58) Field of Classification Search
CPC ................ B41J 2/04563; B41J 2/04566; B41J 2/04581; B41J 2/14233; B41J 2/161;

(Continued)

(56) References Cited

U.S. PATENT DOCUMENTS 7,588,307 B2 * 9/2009 Hong ................... B41J 2/14233
                                                         347/17
12,427,770 B2    9/2025 Takabe
                        (Continued)

FOREIGN PATENT DOCUMENTS

| EP | 1101615 | 5/2001 |
|---|---|---|
| JP | 2010-208136 A | 9/2010 |
| JP | 2015-033834 A | 2/2015 |

OTHER PUBLICATIONS

T. Sakakibara, H. Izu, T. Kura, W. Shinohara, H. Iwata and S. Kiyama, "Development of high-voltage photovoltaic micro-devices for an energy supply to micromachines," 1994 5th International Symposium on Micro Machine and Human Science Proceedings, Nagoya, Japan, 1994, pp. 71-76 (Year: 2025).*

*Primary Examiner* — Stephen D Meier
*Assistant Examiner* — Thomas Ray Knief
(74) *Attorney, Agent, or Firm* — WORKMAN NYDEGGER

(57) ABSTRACT

A liquid ejecting head includes: a piezoelectric element that includes a first drive electrode, a second drive electrode, and a piezoelectric body, the piezoelectric body being provided between the first drive electrode and the second drive electrode in a lamination direction; a pressure chamber substrate that is provided on the one side of the lamination direction with respect to the vibration plate; and detection electrodes that acquire information on humidity and include a first detection electrode in contact with a protective film and a second detection electrode in contact with the protective film at a position separated from the first detection electrode.

19 Claims, 16 Drawing Sheets

(51) Int. Cl.
    *H10N 30/87*         (2023.01)
    *H10N 30/88*         (2023.01)

(52) U.S. Cl.
    CPC ........ *H10N 30/883* (2023.02); *B41J 2/04581*
                (2013.01); *B41J 2002/14241* (2013.01)

(58) Field of Classification Search
    CPC ................... B41J 2/1612; B41J 2/1607; B41J
              2002/14241; B41J 2002/14258; H10N
                          30/88; H10N 30/883
    USPC ......................................................... 347/68
    See application file for complete search history.

(56)                  References Cited

U.S. PATENT DOCUMENTS

| | | | |
|---|---|---|---|
| 2018/0264807 A1* | 9/2018 | Ito | B41J 2/161 |
| 2019/0077151 A1* | 3/2019 | Hirai | B41J 2/1628 |
| 2024/0165947 A1 | 5/2024 | Takabe | |

\* cited by examiner

LIQUID EJECTING HEAD AND LIQUID EJECTING APPARATUS

The present application is based on, and claims priority from JP Application Serial Number 2022-184621, filed Nov. 18, 2022, the disclosure of which is hereby incorporated by reference herein in its entirety.

BACKGROUND

1. Technical Field

The present disclosure relates to a liquid ejecting head and a liquid ejecting apparatus.

2. Related Art

There is known a liquid ejecting head including a pressure chamber plate provided with pressure chambers, a vibration plate for generating a pressure in the pressure chamber, and a piezoelectric actuator including a piezoelectric element provided on the vibration plate. For example, JP-A-2015-33834 discloses that a piezoelectric actuator is covered with a case portion and a humidity sensor is provided in a space inside the case portion. JP-A-2015-33834 is an example of the related art.

Performance of the piezoelectric actuator or a member in the vicinity of the piezoelectric actuator may be deteriorated because of an influence of humidity. The technique in the related art does not propose, for example, a specific structure for adopting a humidity sensor, such as a structure of the humidity sensor itself, a disposition position of the humidity sensor with respect to the piezoelectric actuator and the member in the vicinity of the piezoelectric actuator, and the like. As a result, in the technique in the related art, there is a possibility that information on humidity in the piezoelectric actuator or the member in the vicinity of the piezoelectric actuator cannot be appropriately acquired.

SUMMARY

According to one aspect of the present disclosure, a liquid ejecting head is provided. A liquid ejecting head includes: a piezoelectric element that includes a first drive electrode, a second drive electrode, and a piezoelectric body, the piezoelectric body being provided between the first drive electrode and the second drive electrode in a lamination direction in which the first drive electrode, the second drive electrode, and the piezoelectric body are laminated; a vibration plate that is provided on one side of the lamination direction with respect to the piezoelectric element and is deformed by driving of the piezoelectric element; a pressure chamber substrate that is provided on one side of the lamination direction with respect to the vibration plate and is provided with a plurality of pressure chambers; a protective film that is disposed on another side of the lamination direction with respect to the pressure chamber substrate, the other side of the lamination direction being an opposite side to the one side of the lamination direction; and detection electrodes that include a first detection electrode in contact with the protective film and a second detection electrode in contact with the protective film at a position separated from the first detection electrode.

DESCRIPTION OF EMBODIMENTS

A1. First Embodiment

Figure 1:
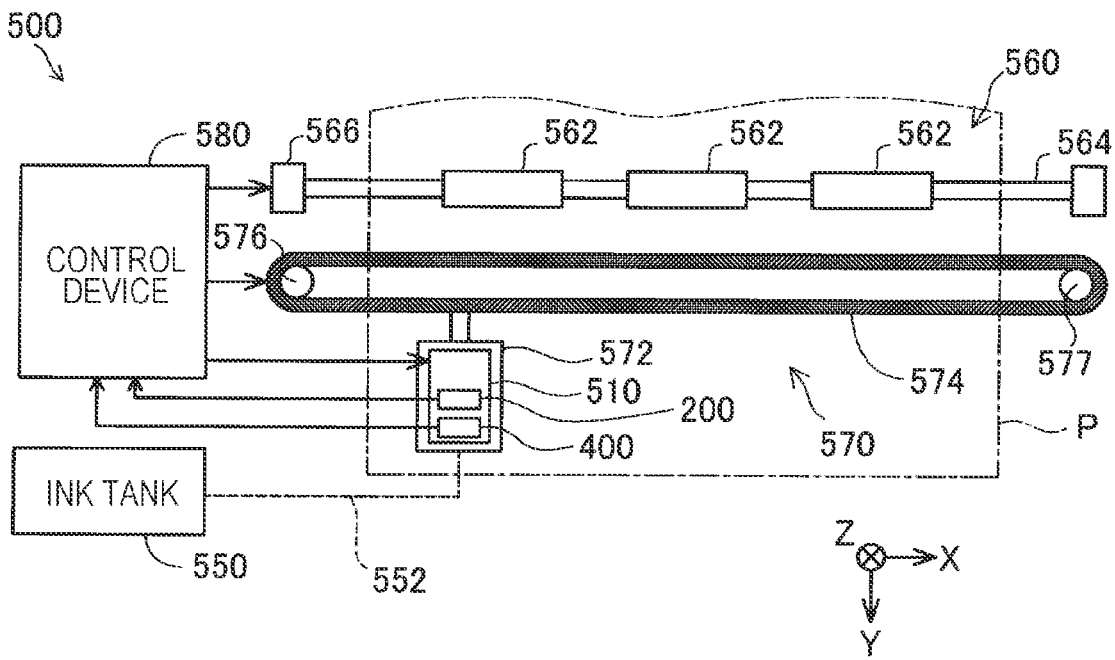
FIG. 1 is an explanatory diagram illustrating a schematic configuration of a liquid ejecting apparatus according to a first embodiment.

FIG. 1 is an explanatory diagram illustrating a schematic configuration of a liquid ejecting apparatus 500 as a first embodiment of the present disclosure. In the present embodiment, the liquid ejecting apparatus 500 is an ink jet printer that forms an image by ejecting ink as an example of a liquid onto printing paper P. The liquid ejecting apparatus 500 may use any kind of medium, such as a resin film or a cloth, as a target on which ink is to be ejected, instead of the printing paper P. X, Y, and Z illustrated in FIG. 1 and each of the drawings subsequent to FIG. 1 represent three spatial axes orthogonal to each other. In the present specification, directions along the axes are also referred to as an X-axis direction, a Y-axis direction, and a Z-axis direction. When specifying the direction, a positive direction is "+" and a negative direction is "−" so that positive and negative signs are used together in the direction notation, and description will be given when a direction to which an arrow faces in each of the drawings is the + direction and an opposite direction thereof is the − direction. In the present embodiment, the Z-axis direction coincides with a vertical direction, the +Z direction indicates vertically downward, and the −Z direction indicates vertically upward. Further, when the positive direction and the negative direction are not limited, the three X, Y, and Z will be described as the X-axis, the Y-axis, and the Z-axis.

The liquid ejecting apparatus 500 includes a liquid ejecting head 510, an ink tank 550, a transport mechanism 560, a moving mechanism 570, and a control device 580. The liquid ejecting head 510 is configured with a plurality of nozzles, ejects inks of a total of four colors, for example, black, cyan, magenta, and yellow in the +Z direction to form an image on a printing paper P. The liquid ejecting head 510 is mounted on a carriage 572 and reciprocates in main scanning directions with the movement of the carriage 572. In the present embodiment, the main scanning directions are the +X direction and the −X direction. The liquid ejecting head 510 may further eject ink of a random color such as light cyan, light magenta or white and transparent ink, in addition to the four colors.

The ink tank 550 accommodates the ink to be ejected to the liquid ejecting head 510. The ink tank 550 is coupled to the liquid ejecting head 510 by a resin tube 552. The ink in the ink tank 550 is supplied to the liquid ejecting head 510 via the tube 552. Instead of the ink tank 550, a bag-shaped liquid pack formed of a flexible film may be provided.

The transport mechanism 560 transports the printing paper P in a sub-scanning direction. The sub-scanning direction is a direction that intersects with the X-axis direction, which is a main scanning direction, and is the +Y direction and the −Y direction in the present embodiment. The transport mechanism 560 includes a transport rod 564, on which three transport rollers 562 are mounted, and a transport motor 566 for rotatably driving the transport rod 564. When the transport motor 566 rotatably drives the transport rod 564, the printing paper P is transported in the +Y direction, which is the sub-scanning direction. The number of the transport rollers 562 is not limited to three and may be a random number. Further, a configuration in which a plurality of transport mechanisms 560 are provided may be provided.

The moving mechanism 570 includes a carriage 572, a transport belt 574, a moving motor 576, and a pulley 577. The carriage 572 mounts the liquid ejecting head 510 in a state where the ink can be ejected. The carriage 572 is fixed to the transport belt 574. The transport belt 574 is bridged between the moving motor 576 and the pulley 577. When the moving motor 576 is rotatably driven, the transport belt 574 reciprocates in the main scanning direction. Thereby, the carriage 572 fixed to the transport belt 574 also reciprocates in the main scanning direction.

Figure 2:
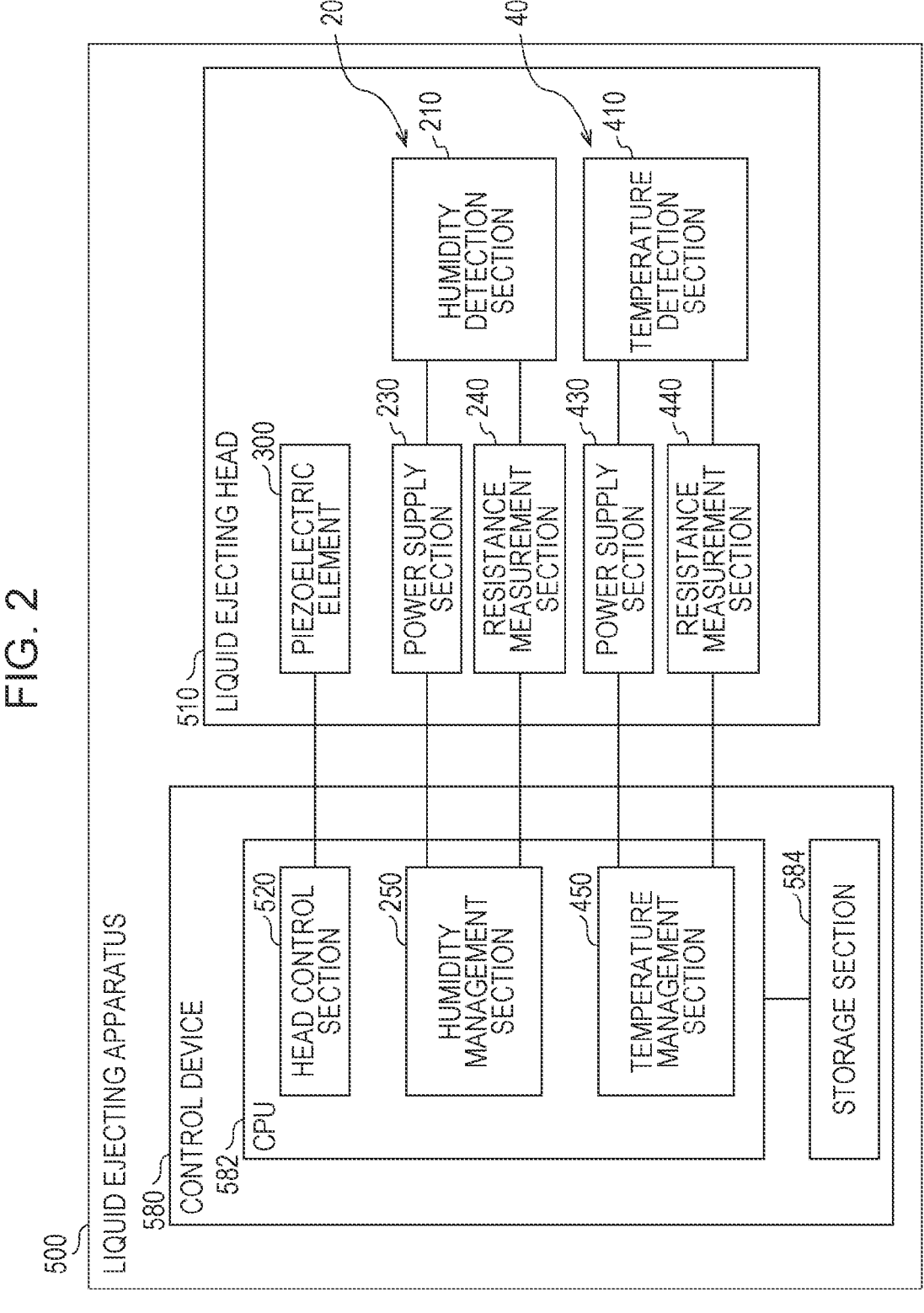
FIG. 2 is a block diagram illustrating a functional configuration of the liquid ejecting apparatus.

FIG. 2 is a block diagram illustrating a functional configuration of the liquid ejecting apparatus 500. In FIG. 2, a partial configuration of the liquid ejecting apparatus 500 such as the ink tank 550, the transport mechanism 560, and the moving mechanism 570 is omitted. As illustrated in FIG. 2, the liquid ejecting head 510 includes a piezoelectric element 300, a humidity detection mechanism 200, and a temperature detection mechanism 400.

The piezoelectric element 300 is a drive element that causes a pressure change in the ink in a pressure chamber of the liquid ejecting head 510. The humidity detection mechanism 200 functions as a so-called electric humidity sensor, and acquires information on humidity in a member included in the liquid ejecting head 510, such as the piezoelectric element 300, or a member on the periphery of the humidity detection mechanism 200. "Information on humidity" includes, for example, an amount of moisture absorbed or dehumidified from a member, relative humidity and absolute humidity which indicate an amount of moisture contained in the air, a degree of an influence on performance of a member because of moisture absorption or dehumidification, and information used to acquire such information, such as a resistance value or a capacitance value. The "degree of an influence on performance of a member" may include the presence or absence of a failure of the member, a temporal change in the performance of the member, and the like.

As illustrated in FIG. 2, the humidity detection mechanism 200 includes a humidity detection section 210, a humidity-detection power supply section 230, and a humidity-detection resistance measurement section 240. In the present embodiment, the humidity detection section 210 is configured with a resistance-detection-type humidity sensor, and uses a property that conductivity of a measurement target changes with moisture absorption. The humidity-detection power supply section 230 is, for example, a constant current circuit, and causes a predetermined current to flow through the humidity detection section 210 under a control of a humidity management section 250. The humidity-detection resistance measurement section 240 detects a resistance value of the humidity detection section 210 based on a current value of a current flowing through the humidity detection section 210 by the humidity-detection power supply section 230 and a voltage value of a voltage generated in the humidity detection section 210. A detection result by the humidity-detection resistance measurement section 240 is output to the humidity management section 250. The humidity-detection power supply section 230 may be a circuit that applies a predetermined voltage to the humidity detection section 210. The humidity-detection power supply section 230 and the humidity-detection resistance measurement section 240 may be provided in the control device 580.

The temperature detection mechanism 400 functions as a temperature sensor that detects a temperature of the ink in a pressure chamber to be described later. Specifically, the temperature detection mechanism 400 detects a temperature of a resistance wiring by using a characteristic that a resistance value of a resistance wiring of a metal, a semiconductor, or the like changes depending on a temperature, and estimates the detected temperature of the resistance wiring as a temperature of the ink in the pressure chamber.

The temperature detection mechanism 400 includes a temperature detection section 410, a temperature-detection power supply section 430, and a temperature-detection resistance measurement section 440. The temperature detection section 410 is configured with a conductor wiring including a resistor for temperature detection. The temperature-detection power supply section 430 is, for example, a constant current circuit, and causes a predetermined current to flow through the temperature detection section 410 under a control of a temperature management section 450. The temperature-detection resistance measurement section 440 acquires a resistance value of a temperature detection resistor of the temperature detection section 410 based on a current value of a current flowing through the temperature detection section 410 by the temperature-detection power supply section 430 and a voltage value of a voltage generated in the temperature detection section 410. A detection result by the temperature-detection resistance measurement section 440 is output to the temperature management section 450.

As illustrated in FIG. 2, the control device 580 is configured as a microcomputer including a CPU 582 and a storage section 584. The control device 580 is mounted on, for example, a wiring substrate 120 or a circuit substrate directly or indirectly coupled to the wiring substrate 120. As the storage section 584, for example, a non-volatile memory such as EEPROM in which data can be erased by an electrical signal, a non-volatile memory such as One-Time-PROM or EPROM in which data can be erased by ultraviolet rays, a non-volatile memory such as PROM in which data cannot be erased, and the like can be used. The storage section 584 stores various programs for realizing functions provided in the present embodiment. The CPU 582 functions as a head control section 520, a humidity management section 250, and a temperature management section 450 by developing and executing a program stored in the storage section 584. The control device 580 may further include a communication section for transmitting and receiving a humidity detection result or a temperature detection result to and from a predetermined server.

The head control section 520 collectively performs a control of each section of the liquid ejecting head 510, such as an ejecting operation. The head control section 520 may control, for example, a reciprocating operation of the carriage 572 along the main scanning direction, and a transport operation of the printing paper P along the sub-scanning direction, in addition to the control of the liquid ejecting head 510. As an ejecting operation of the liquid ejecting head 510, the head control section 520 can control ejection of the ink onto the printing paper P by, for example, outputting a drive signal to the liquid ejecting head 510 to drive the piezoelectric element 300, the drive signal being a signal based on the temperature of the ink in the pressure chamber that is acquired from the temperature management section 450.

The humidity management section 250 derives information on humidity as a detection target by using the resistance value of the humidity detection section 210 that is acquired from the humidity-detection resistance measurement section 240 and a humidity calculation equation stored in the storage section 584 in advance. The humidity calculation equation indicates a correspondence relationship between the resistance value of the detection target and the humidity. Instead of the humidity calculation equation, a conversion table indicating a correspondence relationship between the resistance value of the detection target and the humidity may be used. Further, the storage section 584 may store a correspondence relationship between the resistance value of the detection target and the temporal change in the performance of the detection target. The circuit included in the humidity management section 250 can be disposed on, for example, the wiring substrate 120. Thereby, an increase in the size of the liquid ejecting head 510 can be suppressed.

The temperature management section 450 derives the temperature of the ink in the pressure chamber 12 by using the resistance value of the temperature detection resistor of the temperature detection section 410 that is acquired from the temperature-detection resistance measurement section 440 and a temperature calculation equation stored in the storage section 584 in advance. The temperature calculation equation indicates a correspondence relationship between the resistance value of the temperature detection resistor and the temperature. Instead of the temperature calculation equation, a conversion table indicating a correspondence relationship between the resistance value of the temperature detection resistor and the temperature may be used. The temperature management section 450 outputs the derived temperature of the ink in the pressure chamber 12 to the head control section 520.

Figure 3:
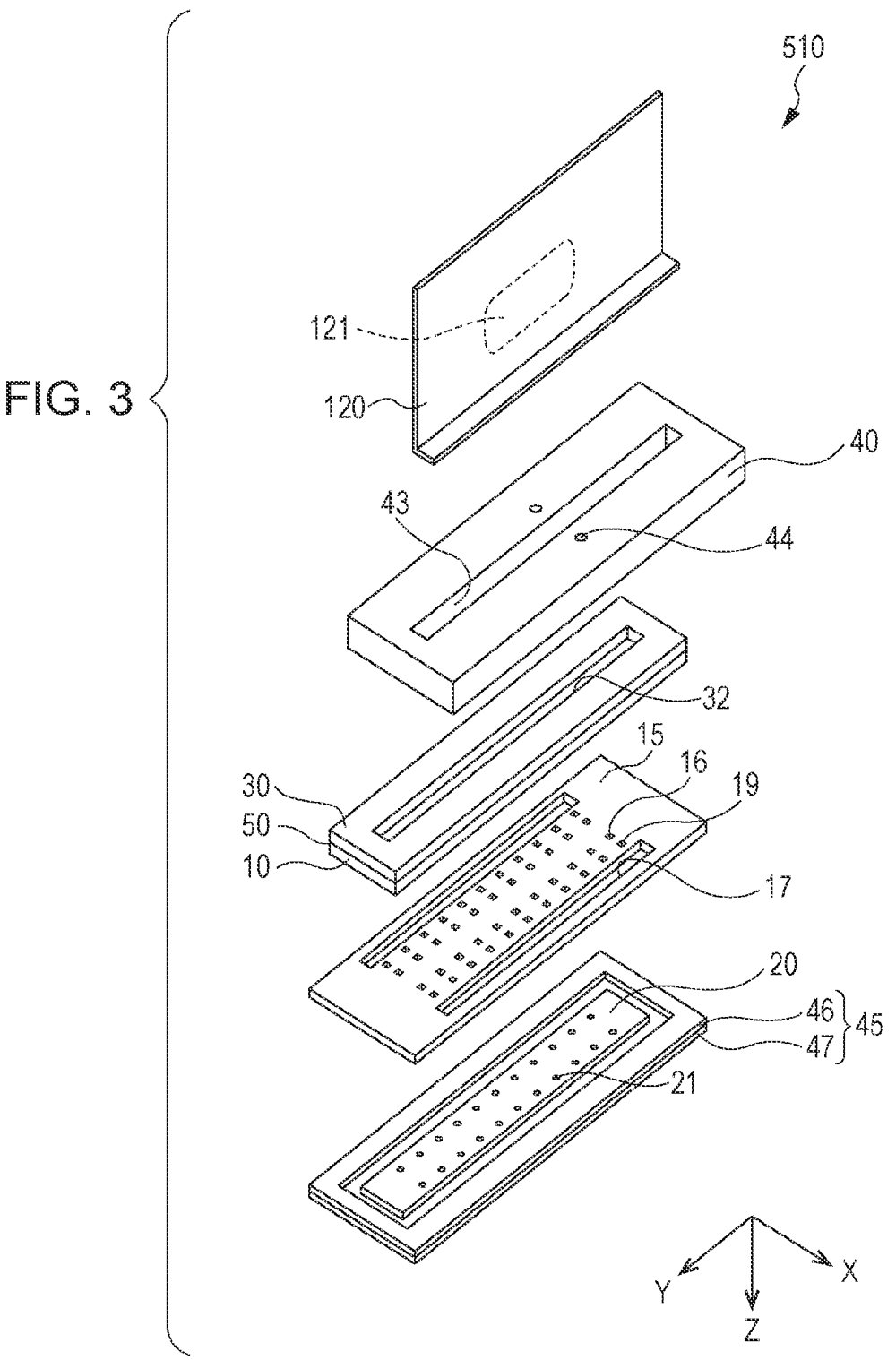
FIG. 3 is an exploded perspective view illustrating a configuration of a liquid ejecting head.
Figure 4:
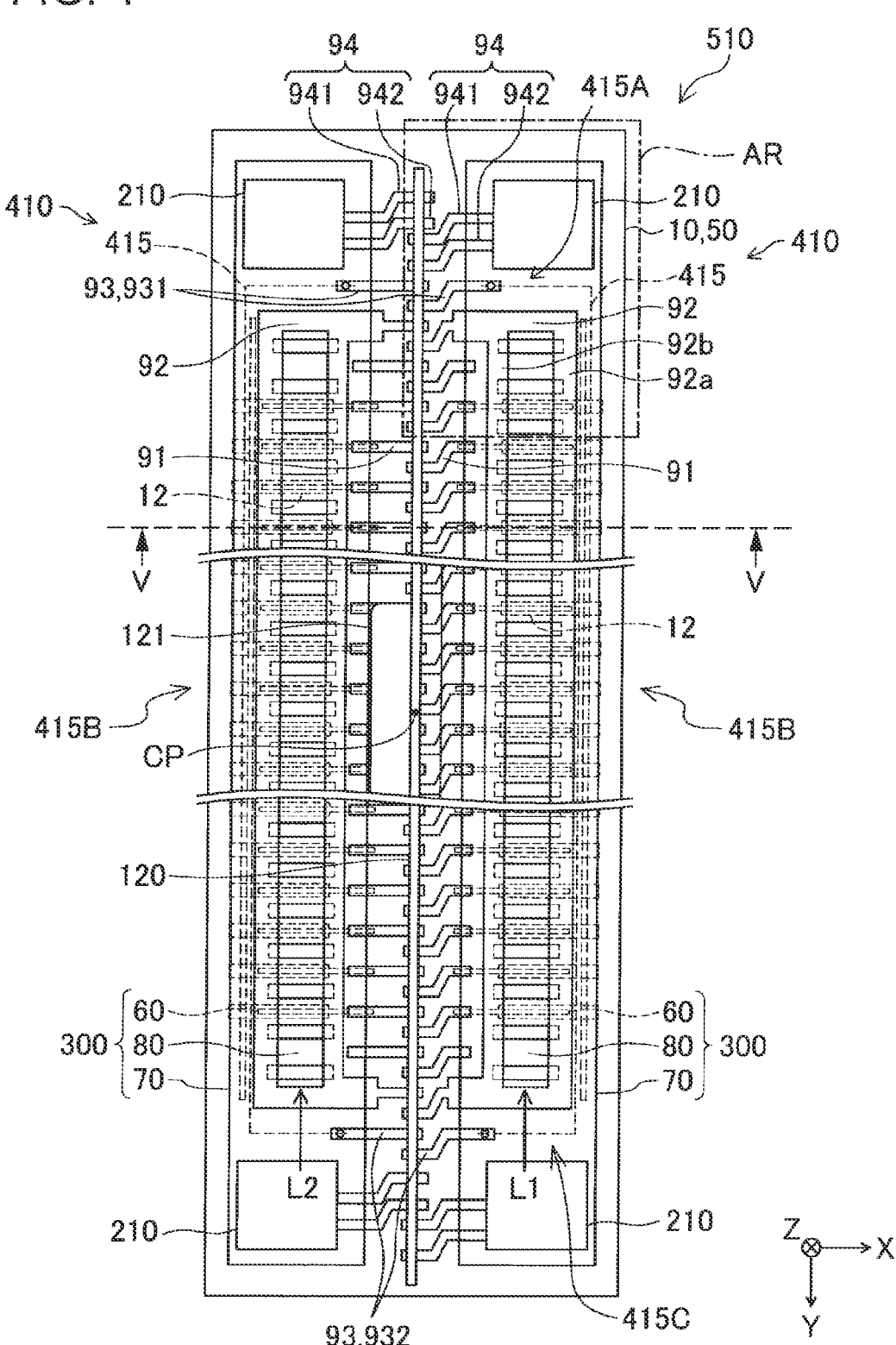
FIG. 4 is an explanatory diagram illustrating a configuration of the liquid ejecting head in plan view.
Figure 5:
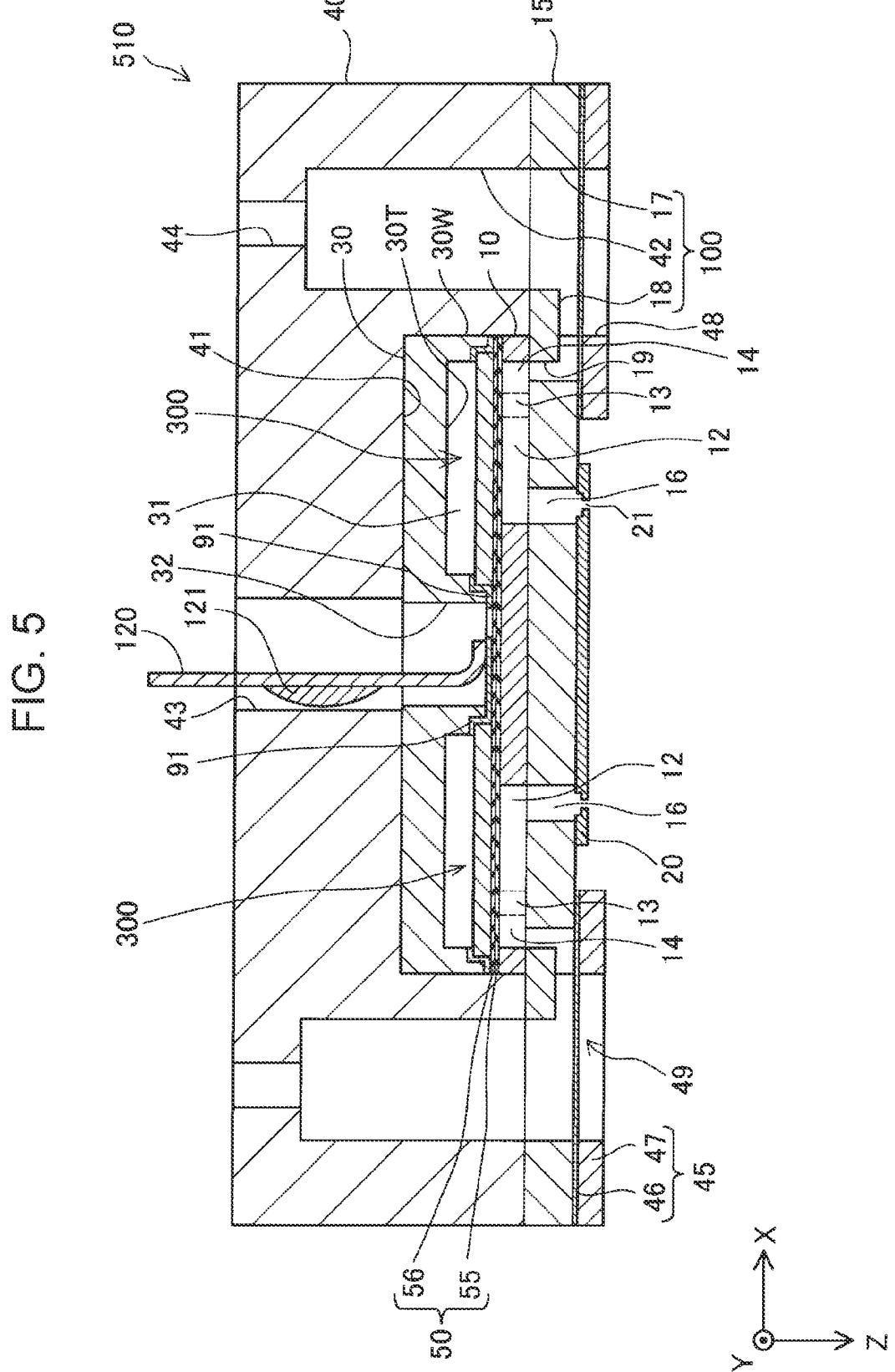
FIG. 5 is a cross-sectional view illustrating a V-V position of FIG. 4.

A detailed configuration of the liquid ejecting head 510 will be described with reference to FIG. 3 to FIG. 5. FIG. 3 is an exploded perspective view illustrating the configuration of the liquid ejecting head 510. FIG. 4 is an explanatory diagram illustrating the configuration of the liquid ejecting head 510 in plan view. In the present disclosure, the "plan view" means a state in which an object is viewed along a lamination direction to be described later. FIG. 4 illustrates the configuration around a pressure chamber substrate 10 and a vibration plate 50 in the liquid ejecting head 510. In order to facilitate understanding of the technique, a protective film 82, a sealing substrate 30, a case member 40, and the like are not illustrated. FIG. 5 is a cross-sectional view illustrating a V-V position of FIG. 4.

The liquid ejecting head 510 includes a pressure chamber substrate 10, a communication plate 15, a nozzle plate 20, a compliance substrate 45, a vibration plate 50, a sealing substrate 30, a case member 40, a wiring substrate 120, which are illustrated in FIG. 3, and a piezoelectric element 300 illustrated in FIG. 4. The liquid ejecting head 510 is configured by laminating these laminated members. In the present disclosure, a direction in which the laminated members of the liquid ejecting head 510 are laminated is also referred to as a "lamination direction". In the present embodiment, the lamination direction coincides with the Z-axis direction. In the present disclosure, the +Z direction side with respect to a predetermined reference position is also referred to as "one side of the lamination direction" or "lower side", and the −Z direction side with respect to a predetermined reference position is also referred to as "the other side of the lamination direction" or "upper side".

The pressure chamber substrate 10 is configured by using, for example, a silicon substrate, a glass substrate, an SOI substrate, various ceramic substrates, and the like. As illustrated in FIG. 4, a plurality of pressure chambers 12 are provided on the pressure chamber substrate 10. An ink flow path provided on the pressure chamber substrate 10, such as the pressure chamber 12, is formed by anisotropically etching the pressure chamber substrate 10 from the surface on the +Z direction side. The pressure chamber 12 is formed in a substantially rectangular shape in which a length in the X-axis direction is longer than a length in the Y-axis direction in plan view. On the other hand, the shape of the pressure chamber 12 is not limited to the rectangular shape, and may be a parallelogram shape, a polygonal shape, a circular shape, an oval shape, or the like. The oval shape means a shape in which both end portions in a longitudinal direction are semicircular based on a rectangular shape, and includes a rounded rectangular shape, an elliptical shape, an egg shape, and the like.

As illustrated in FIG. 4, a plurality of pressure chambers 12 are arranged along a predetermined direction in the pressure chamber substrate 10. In plan view of the liquid ejecting head 510 along the lamination direction, a direction in which the plurality of pressure chambers 12 are arranged is also referred to as an "arrangement direction". In the present embodiment, the plurality of pressure chambers 12 are arranged in two rows parallel to each other with the Y-axis direction as the arrangement direction. In the example of FIG. 4, the pressure chamber substrate 10 is provided with two pressure chamber rows, that is, a first pressure chamber row L1 having a first arrangement direction parallel to the Y-axis direction and a second pressure chamber row L2 having a second arrangement direction parallel to the Y-axis direction. The first pressure chamber row L1 and the second pressure chamber row L2 are disposed on both sides with the wiring substrate 120 interposed therebetween. Specifically, the second pressure chamber row L2 is disposed on the opposite side of the first pressure chamber row L1 with the wiring substrate 120 interposed therebetween in the direction that intersects with the arrangement direction of the first pressure chamber row L1. The direction orthogonal to both the arrangement direction and the lamination direction is also referred to as an "intersection direction". In the example of FIG. 4, the intersection direction is the X-axis direction, and the second pressure chamber row L2 is disposed in the −X direction with respect to the first pressure chamber row L1 with the wiring substrate 120 interposed between the first pressure chamber row L1 and the second pressure chamber row L2. In the plurality of pressure chambers 12, all the pressure chambers 12 do not necessarily have to be arranged in a straight line. For example, the plurality of pressure chambers 12 may be arranged along the Y-axis direction according to so-called staggered arrangement in which every other pressure chamber 12 is alternately disposed in the intersection direction.

As illustrated in FIG. 3, the communication plate 15, the nozzle plate 20, and the compliance substrate 45 are laminated on the +Z direction side of the pressure chamber substrate 10. The communication plate 15 is, for example, a flat plate member using a silicon substrate, a glass substrate, an SOI substrate, various ceramic substrates, a metal substrate, or the like. Examples of the metal substrate include a stainless steel substrate or the like. The communication plate 15 is provided with a nozzle communication path 16, a first manifold portion 17, a second manifold portion 18 illustrated in FIG. 5, and a supply communication path 19. Preferably, the communication plate 15 is formed by using a material having a thermal expansion coefficient substantially the same as a thermal expansion coefficient of the pressure chamber substrate 10. Thereby, when the temperatures of the pressure chamber substrate 10 and the communication plate 15 change, warpage of the pressure chamber substrate 10 and the communication plate 15 because of a difference in the thermal expansion coefficient can be suppressed.

As illustrated in FIG. 5, the nozzle communication path 16 is a flow path that communicates the pressure chamber 12 and a nozzle 21. The first manifold portion 17 and the second manifold portion 18 function as a part of a manifold 100 which is a common liquid chamber in which a plurality of pressure chambers 12 communicate with each other. The first manifold portion 17 is provided to penetrate the communication plate 15 in the Z-axis direction. Further, as illustrated in FIG. 5, the second manifold portion 18 is provided on a surface of the communication plate 15 on the +Z direction side without penetrating the communication plate 15 in the Z-axis direction.

As illustrated in FIG. 5, the supply communication path 19 is a flow path coupled to a pressure chamber supply path 14 provided on the pressure chamber substrate 10. The pressure chamber supply path 14 is a flow path coupled to one end portion of the pressure chamber 12 in the X-axis direction via a throttle portion 13. The throttle portion 13 is a flow path provided between the pressure chamber 12 and the pressure chamber supply path 14. The throttle portion 13 is a flow path in which an inner wall protrudes from the pressure chamber 12 and the pressure chamber supply path 14 and which is formed narrower than the pressure chamber 12 and the pressure chamber supply path 14. Thereby, the throttle portion 13 is set such that the flow path resistance is higher than those of the pressure chamber 12 and the pressure chamber supply path 14. With the configuration, even when pressure is applied to the pressure chamber 12 by the piezoelectric element 300 when the ink is ejected, the ink in the pressure chamber 12 can be suppressed or prevented from flowing back to the pressure chamber supply path 14. A plurality of supply communication paths 19 are arranged along the Y-axis direction, that is, the arrangement direction, and are individually provided for each of the pressure chambers 12. The supply communication path 19 and the pressure chamber supply path 14 communicate the second manifold portion 18 with each pressure chamber 12, and supply the ink in the manifold 100 to each pressure chamber 12.

The nozzle plate 20 is provided on a side opposite to the pressure chamber substrate 10, that is, on a surface of the communication plate 15 on the +Z direction side with the communication plate 15 interposed between the nozzle plate 20 and the pressure chamber substrate 10. A material of the nozzle plate 20 is not particularly limited, and for example, a silicon substrate, a glass substrate, an SOI substrate, various ceramic substrates, and a metal substrate can be used. Examples of the metal substrate include a stainless steel substrate or the like. As the material of the nozzle plate 20, an organic substance, such as a polyimide resin, can also be used. On the other hand, it is preferable to use a material for the nozzle plate 20 that has substantially the same thermal expansion coefficient as the thermal expansion coefficient of the communication plate 15. Thereby, when the temperatures of the nozzle plate 20 and the communication plate 15 change, warpage of the nozzle plate 20 and the communication plate 15 because of the difference in the thermal expansion coefficient can be suppressed.

A plurality of nozzles 21 are provided on the nozzle plate 20. Each nozzle 21 communicates with each pressure chamber 12 via the nozzle communication path 16. As illustrated in FIG. 3, the plurality of nozzles 21 are arranged along the arrangement direction of the pressure chambers 12, that is, the Y-axis direction. The nozzle plate 20 is provided with two nozzle rows in which the plurality of nozzles 21 are arranged in a row. The two nozzle rows respectively correspond to the first pressure chamber row L1 and the second pressure chamber row L2.

As illustrated in FIG. 5, the compliance substrate 45 is provided together with the nozzle plate 20 on the side opposite to the pressure chamber substrate 10 with the communication plate 15 interposed therebetween, that is, on a surface of the communication plate 15 on the +Z direction side. The compliance substrate 45 is provided on the periphery of the nozzle plate 20, and covers openings of the first manifold portion 17 and the second manifold portion 18 provided in the communication plate 15. The compliance substrate 45 includes, for example, a sealing film 46 made of a flexible thin film and a fixed substrate 47 made of a hard material such as a metal. As illustrated in FIG. 5, a region of the fixed substrate 47 facing the manifold 100 is completely removed in a thickness direction, and thus an opening portion 48 is defined. Therefore, one surface of the manifold 100 is a compliance portion 49 sealed only by the sealing film 46.

As illustrated in FIG. 5, the vibration plate 50 and the piezoelectric element 300 are laminated on a side opposite to the communication plate 15 or the like, that is, on a surface of the pressure chamber substrate 10 on the −Z direction side with the pressure chamber substrate 10 interposed therebetween. The piezoelectric element 300 bends and deforms the vibration plate 50 to cause a pressure change in the ink in the pressure chamber 12. In FIG. 5, illustration of the piezoelectric element 300 is simplified.

The vibration plate 50 is provided between the piezoelectric element 300 and the pressure chamber substrate 10. The vibration plate 50 is provided at a position closer to the pressure chamber substrate 10 side than the piezoelectric element 300, and includes an elastic film 55 containing silicon oxide ($SiO_2$) and an insulator film 56 that is provided on the elastic film 55 and contains a zirconium oxide film ($ZrO_2$). The elastic film 55 constitutes a surface of the flow path, such as the pressure chamber 12, on the −Z direction side. The vibration plate 50 may be configured with, for example, either the elastic film 55 or the insulator film 56, and may further include another film other than the elastic film 55 and the insulator film 56. Examples of the material of the other film include silicon, silicon nitride, and the like.

As illustrated in FIG. 3, the sealing substrate 30 having substantially the same size as the pressure chamber substrate 10 in plan view is further bonded to the surface of the pressure chamber substrate 10 on the −Z direction side by an adhesive or the like. The sealing substrate 30 may be bonded to a protective film 82 to be described later by an adhesive. As illustrated in FIG. 5, the sealing substrate 30 includes a ceiling portion 30T, a wall portion 30W, a holding portion 31, and a through hole 32. The holding portion 31 is a space defined by the ceiling portion 30T and the wall portion 30W, and protects an active portion of the piezoelectric element 300 by accommodating the piezoelectric element 300. In the present embodiment, the holding portions 31 are provided for each row of the piezoelectric elements 300. More specifically, two holding portions 31 corresponding to the first pressure chamber row L1 and the second pressure chamber row L2 are formed to be adjacent to each other. The through hole 32 penetrates the sealing substrate 30 along the Z-axis direction. The through hole 32 is disposed between the two holding portions 31 in plan view, and is formed in a long rectangular shape along the Y-axis direction.

As illustrated in FIG. 5, the case member 40 is fixed on the sealing substrate 30. The case member 40 forms the manifold 100 that communicates with the plurality of pressure chambers 12, together with the communication plate 15. The case member 40 has substantially the same outer shape as the communication plate 15 in plan view, and is bonded to cover the sealing substrate 30 and the communication plate 15.

The case member 40 includes an accommodation section 41, a supply port 44, a third manifold portion 42, and a coupling port 43. The accommodation section 41 is a space having a depth in which the pressure chamber substrate 10, the vibration plate 50, and the sealing substrate 30 can be accommodated. The third manifold portion 42 is a space provided in the vicinity of both ends of the accommodation section 41 in the X-axis direction in the case member 40. The manifold 100 is formed by coupling the third manifold portion 42 to the first manifold portion 17 and the second manifold portion 18 provided in the communication plate 15. The manifold 100 has a long shape in the Y-axis direction. The supply port 44 communicates with the manifold 100 to supply ink to each manifold 100. The coupling port 43 is a through hole that communicates with the through hole 32 of the sealing substrate 30, and the wiring substrate 120 is inserted to the coupling port 43.

In the liquid ejecting head 510, the ink supplied from the ink tank 550 illustrated in FIG. 1 is taken from the supply port 44 illustrated in FIG. 5, and an internal flow path from the manifold 100 to the nozzle 21 is filled with ink. Thereafter, a voltage based on the drive signal is applied to each of the piezoelectric elements 300 corresponding to the plurality of pressure chambers 12. Thereby, the vibration plate 50 bends and deforms together with the piezoelectric element 300, and thus the internal pressure of each pressure chamber 12 increases because of a change in volume of each pressure chamber 12. Therefore, ink droplets are ejected from each nozzle 21.

Figure 6:
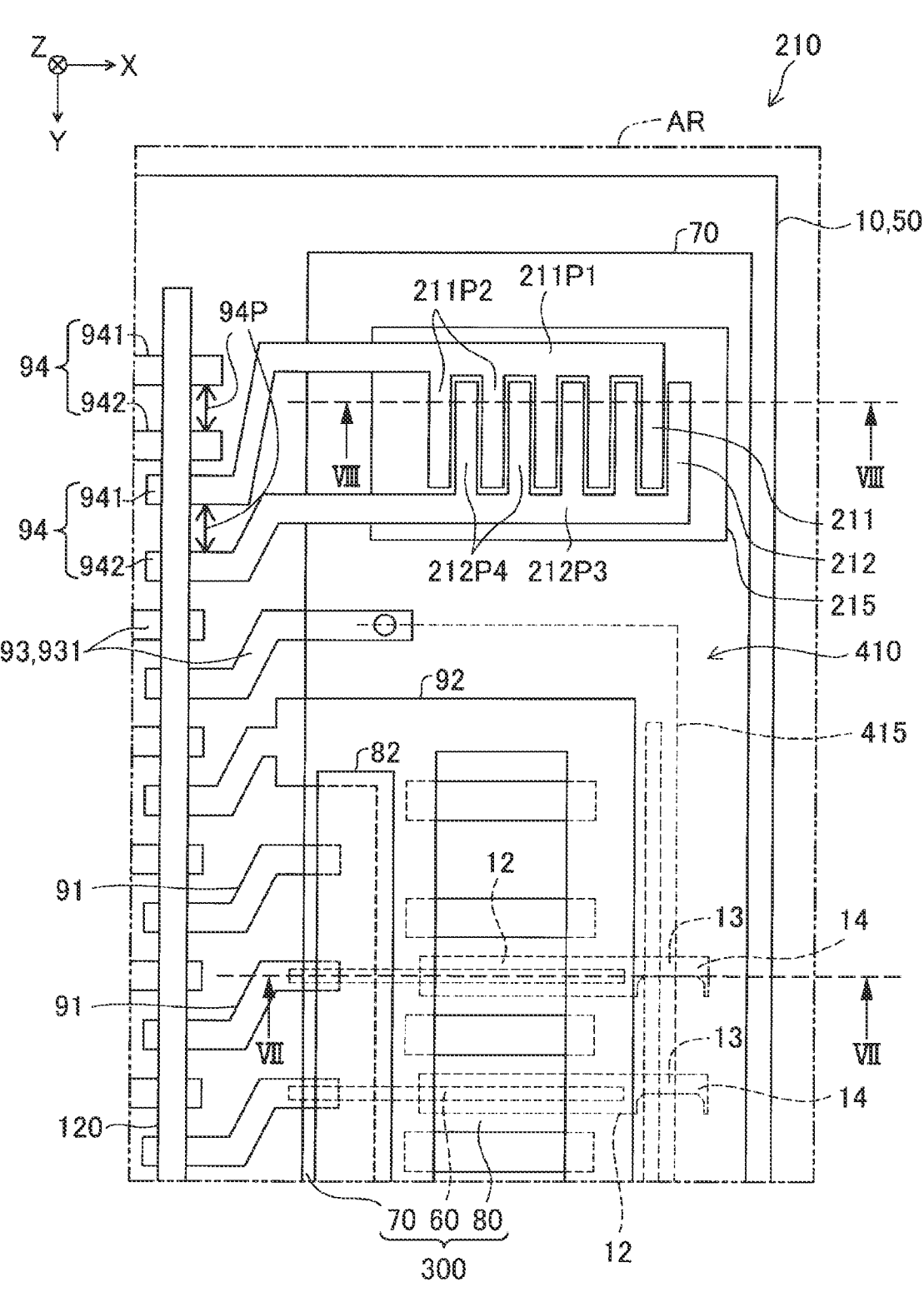
FIG. 6 is an enlarged explanatory diagram illustrating a partial range of FIG. 4.
Figure 7:
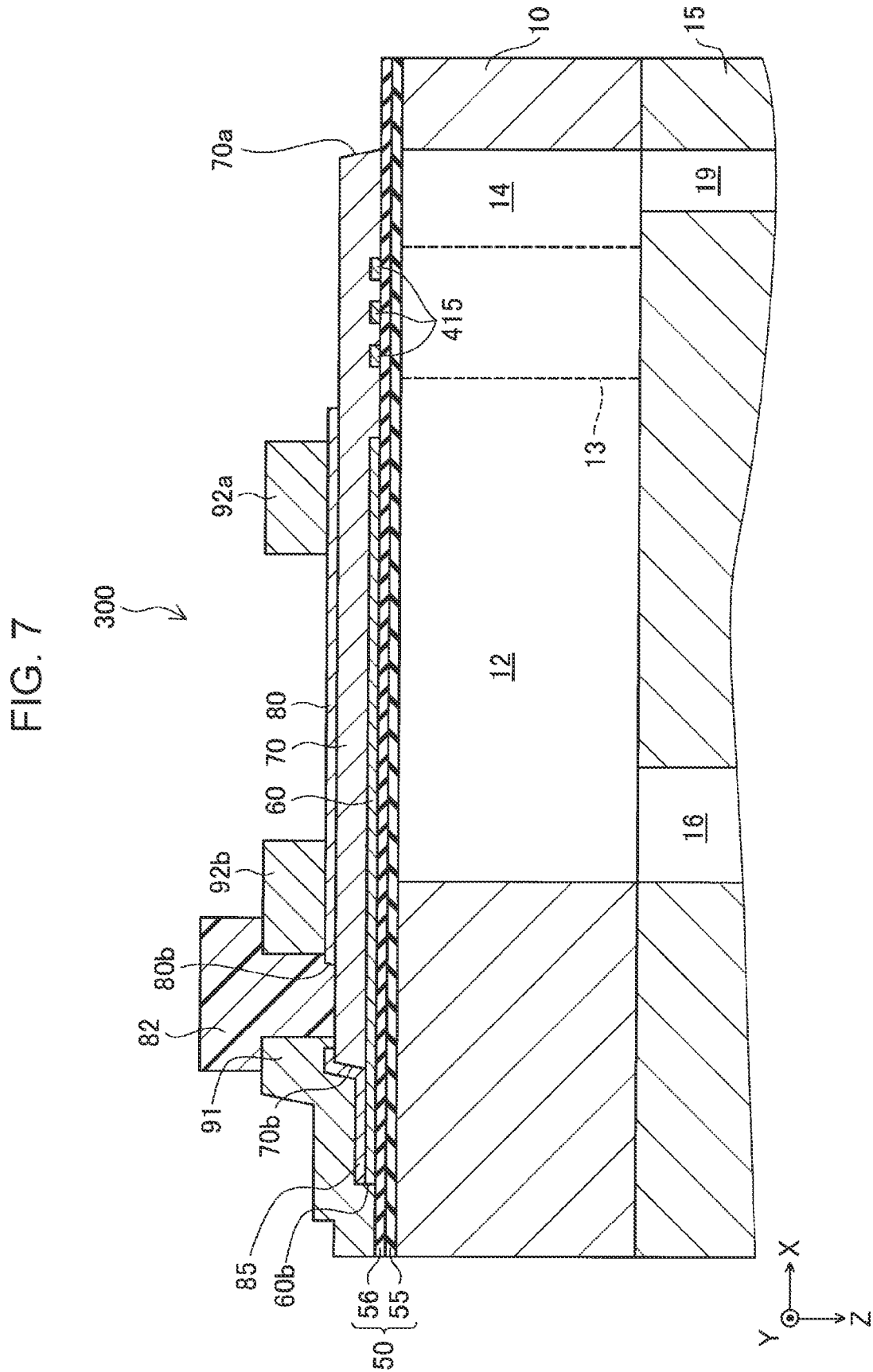
FIG. 7 is a cross-sectional view illustrating a VII-VII position of FIG. 6.

Configurations of the piezoelectric element 300, the humidity detection section 210, and the temperature detection section 410 will be described with reference to FIG. 6 to FIG. 8 as appropriate together with reference to FIG. 4 and FIG. 5. FIG. 6 is an enlarged explanatory diagram illustrating a partial range AR of FIG. 4. FIG. 7 is a cross-sectional view illustrating a VII-VII position of FIG. 6.

As illustrated in FIG. 7, the piezoelectric element 300 includes a first drive electrode 60, a piezoelectric body 70, and a second drive electrode 80. The first drive electrode 60, the piezoelectric body 70, and the second drive electrode 80 are laminated in this order in the −Z direction of the lamination direction. The piezoelectric body 70 is provided between the first drive electrode 60 and the second drive electrode 80 in the lamination direction.

As illustrated in FIG. 6, the first drive electrode 60 and the second drive electrode 80 are electrically coupled to the wiring substrate 120 illustrated in FIG. 5 via drive wirings. The drive wirings include a first drive wiring 91 that electrically couples the wiring substrate 120 and the first drive electrode 60 and a second drive wiring 92 that electrically couples the wiring substrate 120 and the second drive electrode 80. The first drive electrode 60 and the second drive electrode 80 apply a voltage according to the drive signal to the piezoelectric body 70. The drive voltage is a voltage applied to the piezoelectric element 300 from the first drive electrode 60 and the second drive electrode 80 to drive the piezoelectric element 300 by the head control section 520. When a voltage is applied between the first drive electrode 60 and the second drive electrode 80, a part, at which piezoelectric distortion occurs in the piezoelectric body 70, in the piezoelectric element 300 is also referred to as an active portion.

A different drive voltage is applied to the first drive electrode 60 according to an ejection amount of ink, and a predetermined reference voltage is applied to the second drive electrode 80 regardless of the ejection amount of ink. When a voltage difference occurs between the first drive electrode 60 and the second drive electrode 80 because of the application of the drive voltage and the reference voltage, the piezoelectric body 70 of the piezoelectric element 300 is deformed. Because of the deformation of the piezoelectric body 70, the vibration plate 50 is deformed or vibrated, and thus the volume of the pressure chamber 12 changes. Because of the change in the volume of the pressure chamber 12, pressure is applied to the ink accommodated in the pressure chamber 12, and thus the ink is ejected from the nozzle 21 via the nozzle communication path 16.

In the present embodiment, the first drive electrode 60 is an individual electrode individually provided for the plurality of pressure chambers 12. As illustrated in FIG. 7, the first drive electrode 60 is a lower electrode provided on a side opposite to the second drive electrode 80 with the piezoelectric body 70 interposed therebetween, that is, on a lower side of the piezoelectric body 70. A thickness of the first drive electrode 60 is formed to be, for example, approximately 80 nanometers. For example, the first drive electrode 60 is formed of a conductive material including a metal, such as platinum (Pt), iridium (Ir), gold (Au), titanium (Ti), and a conductive metal oxide such as indium tin oxide abbreviated as ITO. The first drive electrode 60 may be formed by laminating a plurality of materials such as platinum (Pt), iridium (Ir), gold (Au), and titanium (Ti). In the present embodiment, platinum (Pt) is used as the first drive electrode 60.

As illustrated in FIG. 4, the piezoelectric body 70 has a predetermined width in the X-axis direction, and has a long rectangular shape along the arrangement direction of the pressure chambers 12, that is, the Y-axis direction. The thickness of the piezoelectric body 70 is formed, for example, from approximately 1000 nanometers to 4000 nanometers. Examples of the piezoelectric body 70 include a crystal film having a perovskite structure provided on the first drive electrode 60 and made of a ferroelectric ceramic material exhibiting an electromechanical conversion action, that is, a so-called perovskite type crystal. As the material of the piezoelectric body 70, for example, a ferroelectric piezo-electric material such as lead zirconate titanate (PZT) or a material to which a metal oxide, such as niobium oxide, nickel oxide, or magnesium oxide, is added can be used. Specifically, lead titanate ($PbTiO_3$), lead zirconate titanate ($Pb(Zr,Ti)O_3$), lead zirconate ($PbZrO_3$), lead lanthanum titanate ($(Pb, La),TiO_3$), lead lanthanum zirconate titanate ($(Pb,La)(Zr,Ti)O_3$), lead magnesium niobate zirconate ($Pb(Zr,Ti)(Mg,Nb)O_3$), or the like can be used. In the present embodiment, lead zirconate titanate (PZT) is used as the piezoelectric body 70.

The material of the piezoelectric body 70 is not limited to the lead-based piezoelectric material containing lead, and a non-lead-based piezoelectric material containing no lead can also be used. Examples of the non-lead-based piezoelectric material include bismuth iron acid ($(BiFeO_3)$, abbreviated to "BFO"), barium titanate ($(BaTiO_3)$, abbreviated to "BT"), potassium sodium niobate ($(K,Na)(NbO_3)$, abbreviated to "KNN"), potassium sodium lithium niobate ($(K,Na,Li)(NbO_3)$), potassium sodium lithium tantalate niobate ($(K,Na,Li)(Nb,Ta)O_3$), bismuth potassium titanate ($(Bi_{1/2}K_{1/2})TiO_3$, abbreviated to "BKT"), bismuth sodium titanate ($(Bi_{1/2}Na_{1/2})TiO_3$, abbreviated to "BNT"), bismuth mangan-ate ($BiMnO_3$, abbreviated to "BM"), a composite oxide containing bismuth, potassium, titanium, and iron and hav-ing a perovskite structure ($x[(Bi_xK_{1-x})TiO_3]-(1-x) [BiFeO_3]$, abbreviated to "BKT-BF"), a composite oxide containing bismuth, iron, barium, and titanium and having a perovskite structure ($(1-x) [BiFeO_3]-x[BaTiO_3]$, abbreviated to "BFO-BT"), and a material ($(1-x) [Bi(Fe_{1-y}M_y)O_3]-x[BaTiO_3]$, M being Mn, Co, or Cr), which is obtained by adding metals such as manganese, cobalt, and chromium to the composite oxide.

As illustrated in FIG. 4, the second drive electrode 80 is a common electrode that is commonly provided for the plurality of pressure chambers 12. The second drive elec-trode 80 has a predetermined width in the X-axis direction, and is provided to extend along the arrangement direction of the pressure chambers 12, that is, the Y-axis direction. As illustrated in FIG. 7, the second drive electrode 80 is an upper electrode provided on a side opposite to the first drive electrode 60 with the piezoelectric body 70 interposed therebetween, that is, on an upper side of the piezoelectric body 70. As a material of the second drive electrode 80, similar to the first drive electrode 60, for example, metals, such as platinum (Pt), iridium (Ir), gold (Au), and titanium (Ti), and conductive materials including conductive metal oxides, such as indium tin oxide abbreviated as ITO, are used. The second drive electrode 80 may be formed by laminating a plurality of materials such as platinum (Pt), iridium (Ir), gold (Au), and titanium (Ti). In the present embodiment, iridium (Ir) is used as the second drive elec-trode 80.

As illustrated in FIG. 7, a protective film 82 is provided on an end portion 80b of the second drive electrode 80 on the −X direction side. As a material of the protective film 82, a material having an electrical insulating property and a moisture barrier property is used. For the protective film 82, for example, an oxide insulating film such as aluminum oxide or hafnia, a polymer material film such as polyimide, or the like can be adopted. When the protective film 82 is a photosensitive resin such as polyimide, a resist layer used in a manufacturing process can be used. A degree of moisture absorption of the protective film 82 changes depending on humidity in the vicinity of the protective film 82, such as a space in the vicinity of the protective film 82. When the protective film 82 is made of a resin material, the surface resistance easily changes depending on the humidity, and thus the protective film 82 can be suitably used as an interlayer 215. In the present embodiment, polyimide is used as an insulating resin material for the protective film 82.

As illustrated in FIG. 6, the protective film 82 is disposed at a drive electrode end portion position that overlaps the end portion of the second drive electrode 80 in plan view of the liquid ejecting head 510, and is formed to cover the end portion 80b of the second drive electrode 80 and the surface of the piezoelectric body 70, as illustrated in FIG. 7. By covering the surface of the piezoelectric body 70 with the protective film 82, the piezoelectric body 70 can be pro-tected from moisture in the outside air and the air. Therefore, the protective film 82 is preferably made of a material having low water vapor permeability. Further, by covering the end portion 80b with the protective film 82, peeling of the second drive electrode 80 from the end portion 80b can be suppressed or prevented. Further, by covering the end portion 80b, driving of the piezoelectric element 300 in the vicinity of the end portion of the active portion of the piezoelectric element 300 can be suppressed. As a result, for example, occurrence of a physical damage such as a crack in a member in the vicinity of the end portion of the active portion, such as a joint portion between the vibration plate 50 and the pressure chamber substrate 10 and the vibration plate 50, can be suppressed. For this reason, the protective film 82 is preferably made of, for example, a material having a high elastic modulus or a high Young's modulus. In the present embodiment, for example, the Young's modulus of the protective film 82 is set to be equal to or higher than 2 GPa from a viewpoint of suitable driving suppression. Further, the protective film 82 has an insulating property, and thus a progress of migration between wirings such as wirings between the end portion 80b and the first drive wiring 91 or the like can be suppressed or prevented. When the second drive electrode 80 is disposed on a lower side of the piezoelectric body 70 as a lower electrode and the first drive electrode 60 is disposed on an upper side of the piezoelectric body 70 as an upper electrode, the drive electrode end portion position means a position overlapping the end portion of the first drive electrode 60 on the −X direction side. On the other hand, the drive electrode end portion position is not limited to only the end portion of the first drive electrode 60 on the −X direction side, and may be set by using an end portion located in any direction of the first drive electrode 60 or the second drive electrode 80, or by using a plurality of end portions obtained by combining end portions of the first drive electrode 60 and the second drive electrode 80.

As illustrated in FIG. 7, a wiring portion 85 is provided on the further −X direction side of the end portion 80b of the second drive electrode 80 in the −X direction. In FIG. 4 and FIG. 6, the wiring portion 85 is not illustrated. The wiring portion 85 is in the same layer as the second drive electrode 80, but is electrically discontinuous with the second drive electrode 80. The wiring portion 85 is formed from the end portion 70b of the piezoelectric body 70 in the −X direction to the end portion 60b of the first drive electrode 60 in the −X direction in a state of being spaced from the end portion 80b of the second drive electrode 80. The end portion 60b of the first drive electrode 60 in the –X direction is pulled out from the end portion 70*b* of the piezoelectric body 70 to the outside. The wiring portion 85 is provided for each piezo-electric element 300, and a plurality of wiring portions 85 are disposed at predetermined intervals along the Y-axis direction. Preferably, the wiring portion 85 is formed in the same layer as the second drive electrode 80. Thereby, a manufacturing process of the wiring portion 85 can be simplified and the cost can be reduced. Here, the wiring portion 85 may be formed in a layer different from the layer of the second drive electrode 80.

As illustrated in FIG. 6 and FIG. 7, the first drive wiring 91 is electrically coupled to the first drive electrode 60 which is an individual electrode, and an extension portion 92*a* and an extension portion 92*b* of the second drive wiring 92 are electrically coupled to the second drive electrode 80 which is a common electrode. The first drive wiring 91 and the second drive wiring 92 function as drive wirings for apply-ing a voltage for driving the piezoelectric body 70 from the wiring substrate 120.

The materials of the first drive wiring 91 and the second drive wiring 92 are conductive materials. For example, gold (Au), copper (Cu), titanium (Ti), tungsten (W), nickel (Ni), chromium (Cr), platinum (Pt), aluminum (Al), and the like can be used. In the present embodiment, gold (Au) is used as the first drive wiring 91 and the second drive wiring 92. The first drive wiring 91 and the second drive wiring 92 are formed in the same layer in a state of being electrically discontinuous with each other. Thereby, a process of form-ing the first drive wiring 91 can be shared with a process of forming the second drive wiring 92. Therefore, as compared with when the first drive wiring 91 and the second drive wiring 92 are individually formed, the manufacturing pro-cess can be simplified and productivity of the liquid ejecting head 510 can be improved. Here, the first drive wiring 91 and the second drive wiring 92 may be formed in different layers from each other. The first drive wiring 91 and the second drive wiring 92 may include an adhesion layer for improving adhesion to the first drive electrode 60, the second drive electrode 80, and the vibration plate 50.

The first drive wiring 91 is individually provided for each first drive electrode 60. As illustrated in FIG. 7, the first drive wiring 91 is coupled to the vicinity of the end portion 60*b* of the first drive electrode 60 via the wiring portion 85, and is pulled out in the –X direction to reach a top of the vibration plate 50. The first drive wiring 91 is electrically coupled to the end portion 60*b* of the first drive electrode 60 in the –X direction, the end portion 60*b* being pulled out from the end portion 70*b* of the piezoelectric body 70 to the outside. The wiring portion 85 may be omitted, and the first drive wiring 91 may be directly coupled to the end portion 60*b* of the first drive electrode 60.

As illustrated in FIG. 4, the second drive wiring 92 extends along the Y-axis direction, bends at both ends in the Y-axis direction, and is pulled out along the X-axis direction. The second drive wiring 92 includes an extension portion 92*a* extending along the Y-axis direction and an extension portion 92*b*. As illustrated in FIG. 4 and FIG. 5, the end portions of the first drive wiring 91 and the second drive wiring 92 are extended so as to be exposed to the through hole 32 of the sealing substrate 30, and are electrically coupled to the wiring substrate 120 in the through hole 32.

The wiring substrate 120 is configured with, for example, a flexible printed circuit (FPC). The wiring substrate 120 is provided with a plurality of wirings for coupling to the control device 580 and a power supply circuit (not illus-trated). In addition, the wiring substrate 120 may be configured with any flexible substrate, such as flexible flat cable (FFC), instead of FPC. An integrated circuit 121 including a switching element and the like is mounted at the wiring substrate 120. A command signal or the like for driving the piezoelectric element 300 is input to the integrated circuit 121. The integrated circuit 121 controls a timing at which a drive signal for driving the piezoelectric element 300 is supplied to the first drive electrode 60 based on the com-mand signal.

As illustrated in FIG. 6, the temperature detection section 410 includes a temperature detection resistor 415 and tem-perature detection wirings 93. The temperature detection resistor 415 is a resistance wiring used for detecting the temperature of the ink in the pressure chamber 12. The temperature detection wiring 93 electrically couples the wiring substrate 120 and the temperature detection resistor 415. More specifically, the temperature detection wirings 93 include a first temperature detection wiring 931 coupled to one end of the temperature detection resistor 415 and a second temperature detection wiring 932 coupled to the other end of the temperature detection resistor 415. The temperature detection wirings 93 are formed in the same layer as, for example, layers of the first drive wiring 91, the second drive wiring 92, and a humidity detection wiring 94 to be described later, and are formed so as to be electrically discontinuous with each other. An end portion of the tem-perature detection wiring 93 extends so as to be exposed to the through hole 32 of the sealing substrate 30, and is electrically coupled to the wiring substrate 120 in the through hole 32.

A material of the temperature detection resistor 415 is a material of which the resistance value is temperature depen-dent. For example, gold (Au), platinum (Pt), iridium (Ir), aluminum (Al), copper (Cu), titanium (Ti), tungsten (W), nickel (Ni), chromium (Cr), or the like can be used. Here, platinum (Pt) can be preferably used as a material of the temperature detection resistor 415 from a viewpoint that the change in resistance with temperature is large and stability and accuracy are high.

As illustrated in FIG. 7, the temperature detection resistor 415 is formed in the same layer as, for example, the layer of the first drive electrode 60 in the lamination direction, and is formed so as to be electrically discontinuous with the first drive electrode 60. In the present embodiment, the tempera-ture detection resistor 415 is formed together with the first drive electrode 60 in a process of forming the first drive electrode 60. As a result, the temperature detection resistor 415 is formed of platinum (Pt), which is the same material as the first drive electrode 60, and a thickness of the temperature detection resistor 415 is approximately 80 nano-meters similar to the first drive electrode 60. Here, the temperature detection resistor 415 is not limited thereto, may be individually formed separately from the process of forming the first drive electrode 60, or may be formed together with a conductor wiring different from the conduc-tor wiring of the first drive electrode 60.

A material of the temperature detection wiring 93 is a conductive material. For example, gold (Au), copper (Cu), titanium (Ti), tungsten (W), nickel (Ni), chromium (Cr), platinum (Pt), aluminum (Al), and the like can be used. The material of the temperature detection wiring 93 is gold (Au) that is the same as the materials of the first drive wiring 91, the second drive wiring 92, and the humidity detection wiring 94 to be described later. Here, any material other than gold (Au) may be used for the temperature detection wiring 93, and the material may be different from the materials of the first drive wiring 91, the second drive wiring 92, and the humidity detection wiring 94.

As illustrated in FIG. 4, in the present embodiment, the temperature detection resistor 415 is continuously formed so as to surround the vicinities of the first pressure chamber row L1 and the second pressure chamber row L2 in plan view. More specifically, the temperature detection resistor 415 includes a first extension portion 415A electrically coupled to the first temperature detection wiring 931, a third extension portion 415C electrically coupled to the second temperature detection wiring 932, and second extension portions 415B between the first extension portion 415A and the third extension portion 415C. A region surrounded by the first extension portion 415A, the second extension portions 415B, and the third extension portion 415C is also referred to as a "temperature detection region". In the example of FIG. 4, there are two temperature detection regions, a first temperature detection region including the first pressure chamber row L1 and a second temperature detection region including the second pressure chamber row L2.

The first extension portion 415A extends along the X-axis direction, which is the intersection direction, on one side in the arrangement direction of the plurality of pressure chambers 12, specifically, on the −Y direction side. The second extension portion 415B is further disposed on an outer side with respect to the first pressure chamber row L1 and the second pressure chamber row L2 in the liquid ejecting head 510, and extends along the Y-axis direction which is the arrangement direction. The third extension portion 415C extends along the X-axis direction, at a position on the other side in the arrangement direction of the plurality of pressure chambers 12, specifically, the +Y direction side. In this way, the temperature detection resistor 415 is disposed so as to surround the vicinities of the first pressure chamber row L1 and the second pressure chamber row L2. By widening a region in which the temperature detection resistor 415 is disposed, the temperature of the entire ink of the liquid ejecting head 510 can be detected.

As illustrated in FIG. 6 and FIG. 7, the temperature detection resistor 415 is disposed so as to pass the vicinity of the ink flow path in the pressure chamber substrate 10. In the present embodiment, the second extension portion 415B of the temperature detection resistor 415 is disposed so as to pass the throttle portion 13 in the vicinity of each pressure chamber 12. In addition, as illustrated in FIG. 4, the second extension portion 415B is formed as a so-called zigzag pattern to be reciprocated a plurality of times along the arrangement direction. By lengthening a wiring length of the portion of the temperature detection resistor 415 that passes the vicinity of the pressure chamber 12 and is likely to contribute to the temperature detection of the ink, accuracy in detection of the temperature of the ink in the pressure chamber 12 can be improved. Here, the second extension portion 415B may be formed in any shape, may be formed, for example, in a zigzag pattern to be reciprocated a plurality of times along the intersection direction instead of the arrangement direction, or may be formed, for example, in any shape such as a linear shape or a wave shape instead of the zigzag pattern. Further, the disposition position of the temperature detection resistor 415 is not limited to the position on the throttle portion 13, and may be any position on the pressure chamber 12. When the temperature detection resistor 415 cannot be disposed on the pressure chamber 12, the temperature detection resistor 415 may be disposed at a position close to the pressure chamber 12.

As illustrated in FIG. 4, in plan view, the humidity detection sections 210 are disposed at total four positions including positions adjacent to both sides of the first pressure chamber row L1 along the first arrangement direction and positions adjacent to both sides of the second pressure chamber row L2 along the second arrangement direction. The humidity detection sections 210 are individually provided for each of the holding portions 31 of the sealing substrate 30 corresponding to the first pressure chamber row L1 and the holding portion 31 of the sealing substrate 30 corresponding to the second pressure chamber row L2. Thereby, information on the humidity of each pressure chamber row can be acquired with high accuracy. Here, the positions of the humidity detection sections 210 are not limited to the four positions. The humidity detection sections 210 may be disposed at any one position of positions adjacent to the first pressure chamber row L1 on the +Y direction side and the −Y direction side and positions adjacent to the second pressure chamber row L2 on the +Y direction side and the −Y direction side in the second arrangement direction, and may be disposed in any positions obtained by combining a plurality of these positions. Here, preferably, the humidity detection sections 210 are formed in a number corresponding to the number of the holding portions 31.

The region in which the humidity detection section 210 is disposed can be formed to be smaller than the region of the temperature detection section 410 or the like. For example, as illustrated in FIG. 4, as compared with the temperature detection region that is particularly long in the arrangement direction and is likely to have a large area in order to measure the entire flow path of the ink, the region in which the interlayer 215 of the humidity detection section 210 is disposed can be reduced. Therefore, for example, by disposing the humidity detection section 210 to be adjacent to the temperature detection region, the humidity detection section 210 and the temperature detection section 410 can be efficiently disposed.

As illustrated in FIG. 6, the humidity detection section 210 includes humidity detection wirings 94, detection electrodes including a first detection electrode 211 and a second detection electrode 212, and an interlayer 215. The interlayer 215 is a humidity detection target, and is formed of a material of which the resistance changes with humidity. Among the members included in the liquid ejecting head 510, for a member of which the performance may deteriorate because of the influence of the humidity in the piezoelectric element 300 or in the vicinity of the piezoelectric element 300, the same material as the material of the protective film 82 at the drive electrode end portion position is adopted for the interlayer 215. For example, the protective film 82 may deteriorate because of relatively high temperature and humidity to cause a problem. On the other hand, by using the protective film 82 as the interlayer 215, a deterioration of the protective film 82 can be detected in advance. The protective film 82 which serves as the interlayer 215 can be disposed in any layer on the upper side of the pressure chamber substrate 10. The protective film 82 does not have to be in contact with the pressure chamber substrate 10. In the present embodiment, the protective film 82 is laminated on the upper side of the piezoelectric body 70 which is in a layer further above the pressure chamber substrate 10. The interlayer 215 may be doped with a metal such as chromium (Cr) by ion filling or the like such that a current for humidity detection is likely to flow. As the interlayer 215, for example, a protective film other than the protective film 82 at the drive electrode end portion position, such as an insulating protective film that is disposed between the first drive electrode 60 and the second drive electrode 80 and insulates the first drive electrode 60 and the second drive electrode 80, may be adopted. The insulating protective film disposed between the first drive electrode 60 and the second drive electrode 80 can be formed of, for example, silicon nitride or silicon oxide.

In the present embodiment, the interlayer 215 is laminated on the piezoelectric body 70 by using the same material as the material of the protective film 82 in a process prior to the process of forming the protective film 82. Here, the interlayer 215 may be provided on the surface of the piezoelectric body 70 together with the protective film 82 in the process of forming the protective film 82. In this case, by sharing the process of forming the interlayer 215 with the process of forming the protective film 82, productivity of the liquid ejecting head 510 can be improved.

The humidity detection wirings 94 include a first humidity detection wiring 941 that electrically couples the wiring substrate 120 and the first detection electrode 211 and a second humidity detection wiring 942 that electrically couples the wiring substrate 120 and the second detection electrode 212. End portions of the first humidity detection wiring 941 and the second humidity detection wiring 942 extend so as to be exposed to the through hole 32 of the sealing substrate 30, and are electrically coupled to the wiring substrate 120 in the through hole 32.

A material of the humidity detection wiring 94 is a conductive material. For example, gold (Au), copper (Cu), titanium (Ti), tungsten (W), nickel (Ni), chromium (Cr), platinum (Pt), aluminum (Al), and the like can be used. The material of the humidity detection wiring 94 is gold (Au) that is the same as the materials of the first drive wiring 91, the second drive wiring 92, and the temperature detection wiring 93. Here, any material other than gold (Au) may be used for the humidity detection wiring 94, and the material may be different from the materials of the first drive wiring 91, the second drive wiring 92, and the temperature detection wiring 93.

As illustrated in FIG. 4, the first drive wiring 91, the second drive wiring 92, the temperature detection wiring 93, and the humidity detection wiring 94 are coupled to the wiring substrate 120 in this order from the center CP of the liquid ejecting head 510 toward the outer side of the liquid ejecting head 510. The "outer side of the liquid ejecting head 510" means a position closer to a circumference edge portion of the pressure chamber substrate 10 than a predetermined reference position in a direction away from the center CP. The liquid ejecting head 510 of the present embodiment is configured to have the following features (1) to (3) by disposing the conductor wirings to be coupled to the wiring substrate 120 in this order.

(1) The first humidity detection wiring 941 and the second humidity detection wiring 942 are further disposed on the outer side of the liquid ejecting head 510 with respect to the first drive wiring 91 and the second drive wiring 92.

(2) The first drive wiring 91 and the second drive wiring 92 are disposed at positions other than the region 94P between the first humidity detection wiring 941 and the second humidity detection wiring 942.

As described above, the drive voltage may be applied to the first drive wiring 91 at a high frequency of ink ejecting timings. By disposing the first humidity detection wiring 941 and the second humidity detection wiring 942 at positions separated from the first drive wiring 91 and the second drive wiring 92, an influence of noise of the drive voltage on the humidity detection can be suppressed or prevented.

(3) The first temperature detection wiring 931 and second temperature detection wiring 932 are further disposed on the outer side of the liquid ejecting head 510 with respect to the first drive wiring 91 and the second drive wiring 92, and the first humidity detection wiring 941 and the second humidity detection wiring 942 are further disposed on the outer side of the liquid ejecting head 510 with respect to the first temperature detection wiring 931 and the second temperature detection wiring 932.

By disposing the temperature detection wiring 93 between the first drive wiring 91 and the second drive wiring 92 and the humidity detection wiring 94, the first humidity detection wiring 941 and the second humidity detection wiring 942 can be disposed at positions away from the first drive wiring 91 and the second drive wiring 92. Therefore, an influence of noise of the drive voltage on the humidity detection can be suppressed or prevented. Further, by disposing the first temperature detection wiring 931 and the second temperature detection wiring 932 at positions closer to the drive wiring than the first humidity detection wiring 941 and the second humidity detection wiring 942, a distance from the humidity detection wiring 94 to the ink flow path can be shortened. Therefore, the wiring lengths of the temperature detection resistor 415 and the temperature detection wiring 93 can be shortened, and thus the temperature and the humidity can be efficiently detected.

The first detection electrode 211 and the second detection electrode 212 are formed in the same layer so as to be electrically discontinuous to each other. The first detection electrode 211 and the second detection electrode 212 are provided on the interlayer 215 to be in contact with the interlayer 215 in order to allow the current from the humidity-detection power supply section 230, which is a constant current circuit, to flow on the surface of the interlayer 215. "current flows through the interlayer 215" includes that a current flows through the inside of the interlayer 215, the surface of the interlayer 215, and a boundary surface between the interlayer 215 and another layer.

Figure 8:
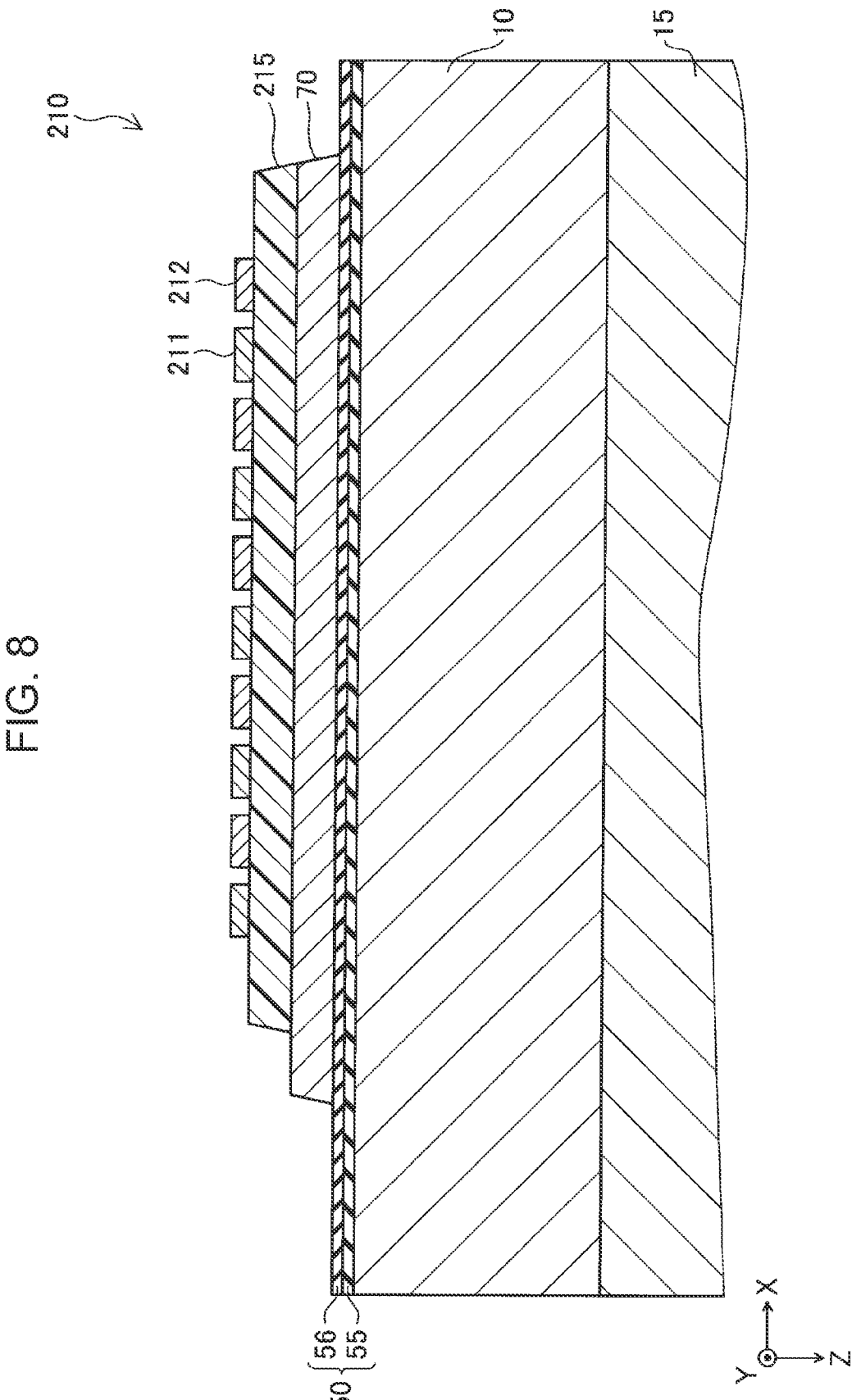
FIG. 8 is a cross-sectional view illustrating a VIII-VIII position of FIG. 6.

FIG. 8 is a cross-sectional view illustrating a VIII-VIII position of FIG. 6. In the present embodiment, as illustrated in FIG. 8, the first detection electrode 211 and the second detection electrode 212 are disposed on the other side of the lamination direction with respect to the interlayer 215, that is, on the upper surface of the interlayer 215. The surface of the interlayer 215 is exposed between the first detection electrode 211 and the second detection electrode 212, and the current from the first detection electrode 211 and the second detection electrode 212 may flow on the surface of the interlayer 215. Thereby, the resistance of the surface of the protective film 82 can be detected. Therefore, a temporal change in the moisture absorption state of the protective film 82 can be managed, and a temporal change in the performance of the protective film 82 because of humidity can be managed.

The first detection electrode 211 and the second detection electrode 212 can be formed in any shape. In the present embodiment, the first detection electrode 211 and the second detection electrode 212 adopt a so-called comb shape suitable for evaluation of insulation deterioration because of ion migration or the like, and are disposed so as to face each other on the surface of the interlayer 215. More specifically, as illustrated in FIG. 6, the first detection electrode 211 includes a first electrode portion 211P1 extending along a certain first direction and a plurality of second electrode portions 211P2 coupled to the first electrode portion 211P1. The plurality of second electrode portions 211P2 extend along a second direction intersecting with the first direction, and are arranged to be separated from each other. In the example of FIG. 6, the first direction coincides with the X-axis direction, and the second direction coincides with the Y-axis direction.

Similarly, the second detection electrode 212 includes a third electrode portion 212P3 extending along a certain third direction and a plurality of fourth electrode portions 212P4 coupled to the third electrode portion 212P3. The fourth electrode portions 212P4 extend along a fourth direction intersecting with the third direction, and are disposed to be separated from each other. In the example of FIG. 6, the third direction coincides with the X-axis direction, and is parallel to the first direction. The fourth direction coincides with the Y-axis direction, and is parallel to the second direction. As illustrated in FIG. 6, the plurality of second electrode portions 211P2 and the plurality of fourth electrode portions 212P4 are alternately disposed. A distance between the plurality of second electrode portions 211P2 and the plurality of fourth electrode portions 212P4 is preferably close enough to be suitable for migration evaluation, and is preferably constant regardless of location.

The first detection electrode 211 and the second detection electrode 212 can be formed of any conductive material, and can be formed of, for example, a conductive material such as a metal, such as platinum (Pt), iridium (Ir), gold (Au), and titanium (Ti), or a conductive metal oxide such as indium tin oxide which is abbreviated as ITO. The first detection electrode 211 and the second detection electrode 212 may be formed by laminating a plurality of materials such as platinum (Pt), iridium (Ir), gold (Au), and titanium (Ti). The first detection electrode 211 and the second detection electrode 212 may be made of the same material or different materials from each other.

In the present embodiment, the same iridium (Ir) as the material of the second drive electrode 80 is used for the first detection electrode 211 and the second detection electrode 212. By sharing the process of forming the first detection electrode 211 and the second detection electrode 212 with the process of forming the second drive electrode 80, productivity of the liquid ejecting head 510 can be improved. For the first detection electrode 211 and the second detection electrode 212, for example, gold (Au), copper (Cu), titanium (Ti), tungsten (W), nickel (Ni), chromium (Cr), platinum (Pt), aluminum (Al), or the like can also be used. The materials of the first detection electrode 211 and the second detection electrode 212 can be the same as the materials of the first drive wiring 91, the second drive wiring 92, the temperature detection wiring 93, and the humidity detection wiring 94. As an example of the process order when sharing the process of forming the first detection electrode 211 and the second detection electrode 212 with the process of forming the second drive electrode 80, first, the interlayer 215 is formed using the same material as the material of the protective film 82, and the first detection electrode 211, the second detection electrode 212, and the second drive electrode 80 are formed in the same process. Thereafter, the protective film 82 is formed at the drive electrode end portion position.

As described above, the liquid ejecting head 510 of the present embodiment includes the piezoelectric element 300 that includes the first drive electrode 60, the second drive electrode 80, and the piezoelectric body 70, the piezoelectric body 70 being provided between the first drive electrode 60 and the second drive electrode 80 in the lamination direction, the vibration plate 50 that is provided on one side of the lamination direction with respect to the piezoelectric element 300 and is deformed by driving of the piezoelectric element 300, the pressure chamber substrate 10 that is provided on one side of the lamination direction with respect to the vibration plate 50 and is provided with the plurality of pressure chambers 12 of which the volume changes according to the deformation of the vibration plate 50, the protective film 82 that is disposed on the other side of the lamination direction with respect to the pressure chamber substrate 10, and the detection electrodes that acquire information on humidity and include the first detection electrode 211 in contact with the protective film 82 and the second detection electrode 212 in contact with the protective film 82 at a position separated from the first detection electrode 211. With the liquid ejecting head 510 of the present embodiment, by detecting the resistance between the first detection electrode 211 and the second detection electrode 212, a degree of moisture absorption of the protective film 82 among the component members of the liquid ejecting head 510 can be detected with high accuracy. Here, the degree of moisture absorption of the protective film 82 changes according to humidity in the vicinity of the protective film 82. Therefore, information on humidity in the piezoelectric element 300, a member in the vicinity of the piezoelectric element 300, or a space in the vicinity of the piezoelectric element 300 can be appropriately detected and managed.

With the liquid ejecting head 510 of the present embodiment, the protective film 82 is formed of a resin material. By forming the interlayer 215 using a resin material of which the surface resistance is likely to change according to humidity, sensitivity of detection of the resistance by the detection electrodes can be improved.

With the liquid ejecting head 510 of the present embodiment, the protective film 82 is formed of an insulating material. For example, a progress of migration between the conductor wirings at a position at which the protective film 82 is laminated as the interlayer, such as migration between the end portion 80b of the second drive electrode 80 and the first drive wiring 91, can be suppressed or prevented.

With the liquid ejecting head 510 of the present embodiment, the protective film 82 is formed of a material having a water vapor permeability lower than the water vapor permeability of the piezoelectric body 70. Therefore, by covering the surface of the piezoelectric body 70 with the protective film 82, the piezoelectric body 70 can be suitably protected from moisture in the air.

With the liquid ejecting head 510 of the present embodiment, the Young's modulus of the protective film 82 is equal to or higher than 2 GPa. Therefore, by covering the end portion of the wiring with the protective film 82, peeling from the end portion of the wiring can be suppressed or prevented. Further, when the protective film 82 covers the end portion of the drive electrode, driving of the piezoelectric element 300 in the vicinity of the end portion of the active portion of the piezoelectric element 300 can be suppressed, and thus occurrence of a physical damage such as a crack in the member in the vicinity of the end portion of the active portion can be suppressed.

With the liquid ejecting head 510 of the present embodiment, the first detection electrode 211 and the second detection electrode 212 are disposed in the same layer on the upper surface with respect to the protective film 82. By forming the first detection electrode 211 and the second detection electrode 212 in the same layer, the process of forming the first detection electrode 211 and the process of forming the second detection electrode 212 can be easily shared. Further, by detecting the resistance on the upper surface that is likely to be influenced by moisture absorption, accuracy of detection of humidity can be improved as compared with when the first detection electrode 211 and the second detection electrode 212 are provided on the inside.

With the liquid ejecting head 510 of the present embodiment, the second detection electrode 212 includes the first electrode portion 211P1 that extends along the first direction on the surface of the protective film 82 and the plurality of second electrode portions 211P2 that are coupled to the first electrode portion 211P1 on the surface of the protective film 82, extend in the second direction intersecting with the first direction, and are arranged to be separated from each other. The first detection electrode 211 includes the third electrode portion 212P3 that extends along the third direction on the surface of the protective film 82 and the plurality of fourth electrode portions 212P4 that are coupled to the third electrode portion 212P3 on the surface of the protective film 82, extend in the fourth direction intersecting with the third direction, and are arranged to be separated from each other. The plurality of second electrode portions 211P2 and the plurality of fourth electrode portions 212P4 are alternately arranged. By forming the first detection electrode 211 and the second detection electrode 212 in a comb shape, accuracy of detection of the resistance can be improved, and thus insulation deterioration because of ion migration or the like can be suitably evaluated.

The liquid ejecting apparatus 500 of the present embodiment includes the liquid ejecting head 510, the humidity management section 250 that applies a predetermined detection voltage to the protective film 82 interposed between the first detection electrode 211 and the second detection electrode 212, and the humidity-detection resistance measurement section 240 that measures the resistance between the first detection electrode 211 and the second detection electrode 212. With the liquid ejecting apparatus 500 of the present embodiment, information on humidity in the member in the liquid ejecting head 510 can be appropriately managed.

In the liquid ejecting apparatus 500 of the present embodiment, the humidity management section 250 acquires a degree of moisture absorption of the protective film 82 that is an example of information on humidity by using the resistance measured by the humidity-detection resistance measurement section 240. With the liquid ejecting apparatus 500 of the present embodiment, the resistance of the surface of the protective film 82 can be detected. Therefore, a temporal change in the moisture absorption state of the protective film 82 can be managed, and a temporal change in the performance of the protective film 82 because of humidity can be managed.

With the liquid ejecting head 510 of the present embodiment, the first detection electrode 211 and the second detection electrode 212 are formed of the same material as the material of the second drive electrode 80. The process of forming the first detection electrode 211 and the second detection electrode 212 can be shared with the process of forming the second drive electrode 80, and thus productivity of the liquid ejecting head 510 can be improved.

With the liquid ejecting head 510 of the present embodiment, in plan view, the humidity detection sections 210 are disposed at positions adjacent to both sides of the first pressure chamber row L1 along the first arrangement direction and positions adjacent to both sides of the second pressure chamber row L2 along the second arrangement direction. With the liquid ejecting head 510 of the present embodiment, by individually providing the humidity detection sections 210 for each of the holding portions 31 of the first pressure chamber row L1 and the second pressure chamber row L2, the information on humidity for each pressure chamber row can be acquired with high accuracy.

A2. Another Embodiment 1

Figure 9:
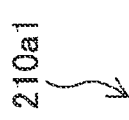
FIG. 9 is an explanatory diagram illustrating a humidity detection section included in a liquid ejecting head according to another embodiment.

FIG. 9 is an explanatory diagram illustrating the humidity detection section 210a1 included in the liquid ejecting head of another embodiment. The first embodiment describes an example in which the first detection electrode 211 and the second detection electrode 212 are disposed on the upper side of the interlayer 215. On the other hand, as in the humidity detection section 210a1 illustrated in FIG. 9, the first detection electrode 211a1 and the second detection electrode 212a1 may be disposed in the same layer on the lower side of the interlayer 215. Even in such a configuration, as in the first embodiment, the information on the humidity of the interlayer 215 can be detected with high accuracy, and the influence of the humidity on the piezoelectric element 300 and the member in the vicinity of the piezoelectric element 300 can be appropriately managed. Even in such a configuration, the process of forming the first detection electrode 211a1 and the second detection electrode 212a1 and the process of forming the second drive electrode 80 can be shared. As an example of the process order in this case, first, the first detection electrode 211a1, the second detection electrode 212a1, and the second drive electrode 80 can be formed in the same process, and then the protective film 82 at the drive electrode end portion position and the interlayer 215 can be simultaneously formed using the same material. Therefore, productivity of the liquid ejecting head can be improved.

In the example of FIG. 9, the first detection electrode 211a1 and the second detection electrode 212a1 are provided on the upper side of the piezoelectric body 70, and are disposed between the piezoelectric body 70 and the interlayer 215. In this case, an influence of humidity on the layer on the upper side of the boundary surface on which the first detection electrode 211a1 and the second detection electrode 212a1 are disposed, that is, an influence of humidity on the interlayer 215 in the example of FIG. 9 can be acquired. It is considered that this is because the current flowing between the first detection electrode 211a1 and the second detection electrode 212a1 is more likely to flow to the lower surface of the upper layer which is more likely to be a porous layer than the lower layer. It is considered that the reason why the lower surface of the upper layer is more likely to be a porous layer is that the upper layer is easily affected by a crystal structure of the lower layer when the upper layer is laminated.

B1. Second Embodiment

Figure 10:
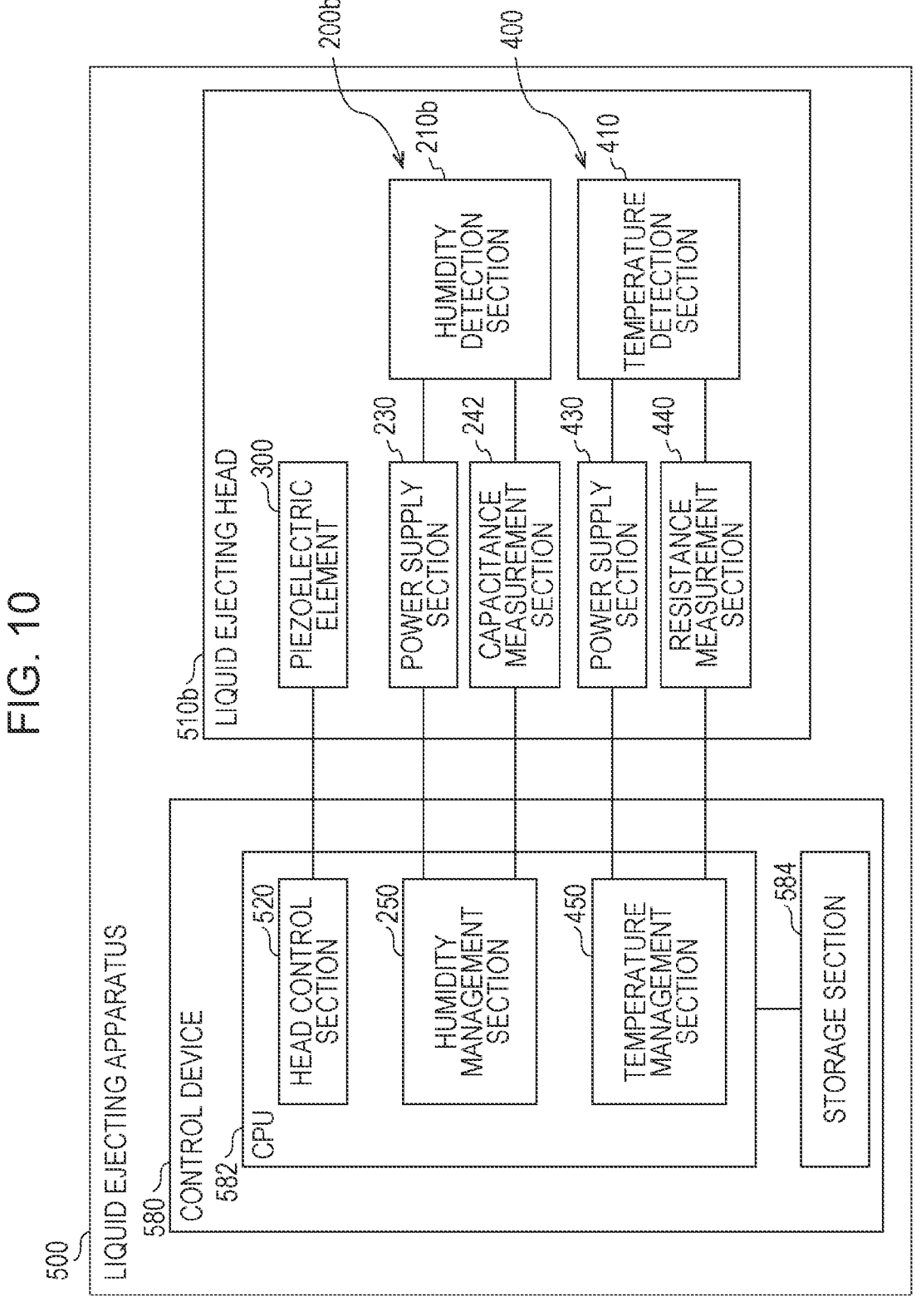
FIG. 10 is a block diagram illustrating a functional configuration of a liquid ejecting head according to a second embodiment.

FIG. 10 is a block diagram illustrating a functional configuration of the liquid ejecting head 510b according to a second embodiment of the present disclosure. The liquid ejecting head 510b of the second embodiment is different from the liquid ejecting head 510 of the first embodiment in that a humidity detection mechanism 200b is provided instead of the humidity detection mechanism 200, and the other configurations are the same.

As illustrated in FIG. 10, the humidity detection mechanism 200b includes a humidity detection section 210b instead of the humidity detection section 210, and includes a capacitance measurement section 242 instead of the humidity-detection resistance measurement section 240. In the present embodiment, the humidity detection section 210b is configured with a capacitance type humidity sensor, and utilizes a property that the dielectric constant changes and the capacitance changes because of moisture absorption of the measurement target. The humidity-detection power supply section 230 applies a predetermined voltage to the humidity detection section 210*b* under a control of the humidity management section 250. The capacitance measurement section 242 detects capacitance of the humidity detection section 210*b* by using, for example, a method of measuring a time until a voltage value of the voltage applied to the humidity detection section 210*b* by the humidity-detection power supply section 230 reaches a predetermined reference voltage. A detection result by the capacitance measurement section 242 is output to the humidity management section 250.

The humidity management section 250 derives information on the humidity of the detection target by using the capacitance of the humidity detection section 210*b* that is acquired from the capacitance measurement section 242 and a humidity calculation equation stored in the storage section 584 in advance. The humidity calculation equation indicates a correspondence relationship between the capacitance of the detection target and the humidity. Instead of the humidity calculation equation, a conversion table indicating a correspondence relationship between the capacitance of the detection target and the humidity may be used. In addition, the storage section 584 may store a correspondence relationship between the capacitance of the detection target and a temporal change in performance of the detection target. The capacitance may be measured by using various general methods such as a constant current discharge method. The capacitance measurement section 242 may be provided in the control device 580.

Figure 11:
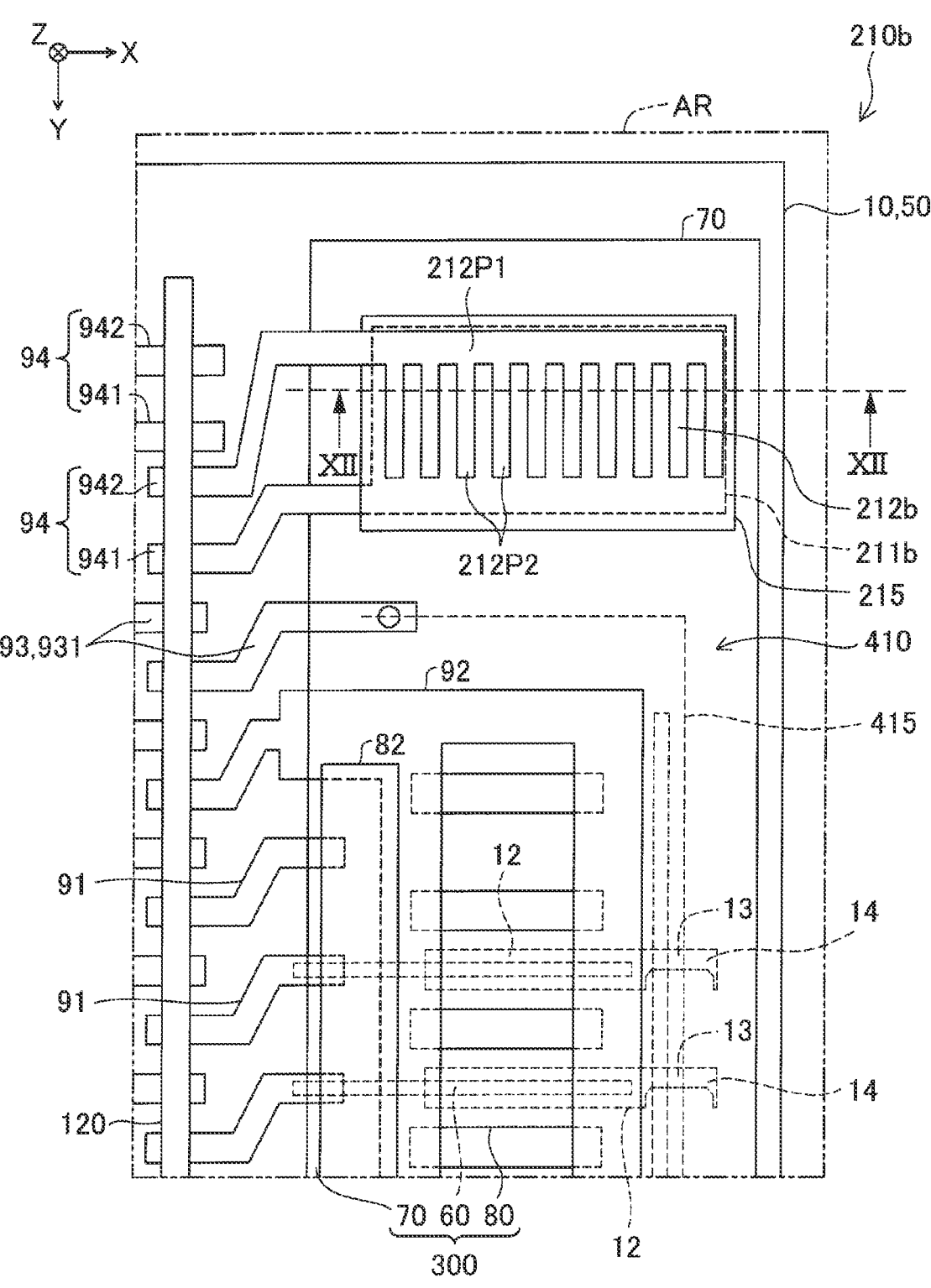
FIG. 11 is an enlarged explanatory diagram illustrating the vicinity of a humidity detection section.

FIG. 11 is an enlarged explanatory diagram illustrating the vicinity of the humidity detection section 210*b*. As illustrated in FIG. 11, the disposition position of the humidity detection section 210*b* in plan view is the same as the disposition position in the first embodiment.

As illustrated in FIG. 11, the humidity detection section 210*b* includes humidity detection wirings 94, a first detection electrode 211*b*, a second detection electrode 212*b*, and an interlayer 215. Since the configuration of the humidity detection wiring 94 is the same as the configuration in the first embodiment, a description thereof will be omitted. The interlayer 215 is a humidity detection target, and functions as a so-called humidity-sensitive film. The interlayer 215 is formed of a material of which the capacitance changes with humidity. In the present embodiment, as in the first embodiment, the same material as the material of the protective film 82 is used for the interlayer 215. For the interlayer 215, for example, a material suitable as a humidity-sensitive film, such as a polymer material such as a cellulose compound, a polyvinyl compound, or an aromatic polymer, or a metal oxide such as aluminum oxide ($Al_2O_3$) or silicon oxide ($SiO_2$), can also be used.

Figure 12:
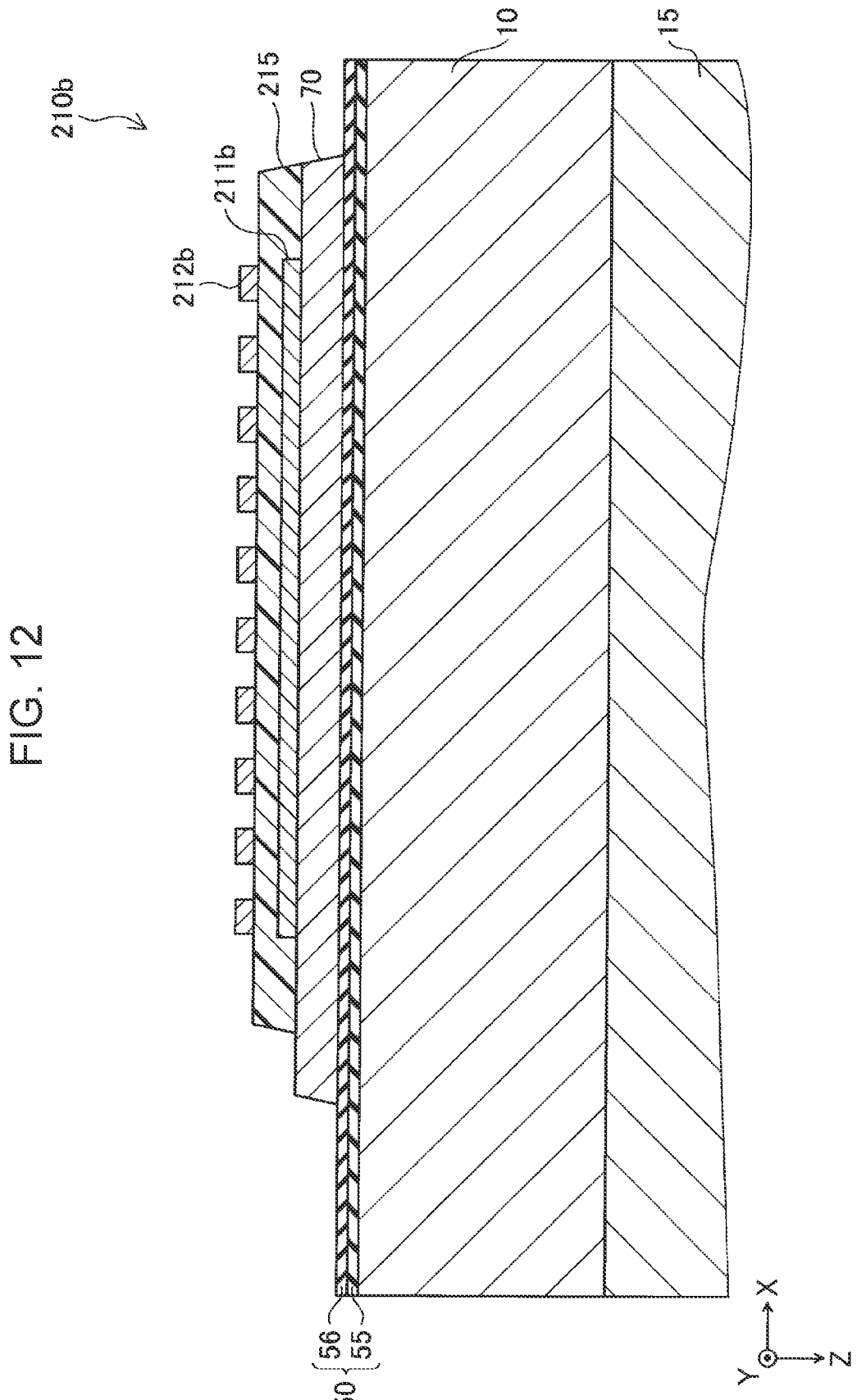
FIG. 12 is a cross-sectional view illustrating an XII-XII position of FIG. 11.

FIG. 12 is a cross-sectional view illustrating an XII-XII position of FIG. 11. As illustrated in FIG. 12, the first detection electrode 211*b* and the second detection electrode 212*b* are formed in different layers, and are electrically discontinuous with each other. The first detection electrode 211*b* and the second detection electrode 212*b* apply a voltage from the humidity-detection power supply section 230 to the interlayer 215. The first detection electrode 211*b* and the second detection electrode 212*b* are both in contact with the interlayer 215, and are disposed so as to face each other with the interlayer 215 interposed therebetween. More specifically, the first detection electrode 211*b* is disposed on one side of the lamination direction, that is, on the lower side of the interlayer 215, and the second detection electrode 212*b* is disposed on the other side of the lamination direction, that is, on the upper side of the interlayer 215. With the configuration, by detecting the change in the capacitance between the first detection electrode 211*b* and the second detection electrode 212*b*, a temporal change in the moisture absorption state of the protective film 82 that serves as the interlayer 215 can be managed, and thus a temporal change in the performance of the protective film 82 because of humidity can be managed.

The first detection electrode 211*b* and the second detection electrode 212*b* can be formed in any shape. In the present embodiment, the first detection electrode 211*b* is formed in a flat plate shape. The second detection electrode 212*b* has the same comb shape as the shape of the first detection electrode 211 or the second detection electrode 212 illustrated in the first embodiment. More specifically, as illustrated in FIG. 11, the second detection electrode 212*b* includes a first electrode portion 212P1 extending along a certain first direction and a plurality of second electrode portions 212P2 coupled to the first electrode portion 212P1. The plurality of second electrode portions 212P2 extend along a second direction intersecting with the first direction, and are arranged to be separated from each other. In the example of FIG. 11, the first direction coincides with the X-axis direction, and the second direction coincides with the Y-axis direction.

Since the second detection electrode 212*b* is formed to cover the upper surface of the interlayer 215, the exposed area of the interlayer 215 can be reduced. As a result, there is a possibility that moisture absorption and dehumidification of the interlayer 215 are inhibited and the detection accuracy is lowered. From a viewpoint of suppressing inhibition of moisture absorption and dehumidification of the interlayer 215, preferably, the second detection electrode 212*b* is formed in a shape such as a flat plate shape or a comb shape in which a through hole is formed, that is, in a shape that allows the upper surface of the interlayer 215 to be exposed, or is formed to have an area smaller than the area of the interlayer 215.

In the present embodiment, the process of forming the first detection electrode 211*b* is shared with the process of forming the second drive electrode 80, and the first detection electrode 211*b* is provided on the piezoelectric body 70. Therefore, the material of the first detection electrode 211*b* is the same iridium (Ir) as the material of the second drive electrode 80. By sharing the process of forming the first detection electrode 211*b* with the process of forming the second drive electrode 80, productivity of the liquid ejecting head 510 can be improved.

In the present embodiment, the process of forming the second detection electrode 212*b* is shared with the process of forming the first drive wiring 91, the second drive wiring 92, the temperature detection wiring 93, or the humidity detection wiring 94, and the second detection electrode 212*b* is provided on the interlayer 215. Therefore, the material of the second detection electrode 212*b* is the same gold (Au) as the material of the first drive wiring 91 or the like. By sharing the process of forming the second detection electrode 212*b* with the process of forming the first drive wiring 91 and the like, productivity of the liquid ejecting head 510 can be improved. As an example of a specific process order, after the piezoelectric body 70 is coated, the first detection electrode 211*b* is formed in the same process as the process of forming the second drive electrode 80, and then the interlayer 215 is formed using the same material as the material of the protective film 82. Thereafter, the second detection electrode 212b, the first drive wiring 91, the second drive wiring 92, the temperature detection wiring 93, and the humidity detection wiring 94 are formed in the same process, and then the protective film 82 is formed at the drive electrode end portion position.

As described above, the liquid ejecting head 510b of the present embodiment includes the protective film 82 which is laminated on the piezoelectric body 70 and of which the capacitance changes according to humidity, the protective film 82 being used as the interlayer 215. The first detection electrode 211b is disposed on the lower side of the protective film 82, and the second detection electrode 212b is disposed on the upper side of the protective film 82. With the liquid ejecting head 510b of the present embodiment, the capacitance between the first detection electrode 211b and the second detection electrode 212b can be measured, and thus a degree of moisture absorption of the protective film 82 among the component members of the liquid ejecting head 510b can be detected with high accuracy. Here, the degree of moisture absorption of the protective film changes according to humidity in the vicinity of the protective film. Therefore, information on humidity in the piezoelectric element 300, a member in the vicinity of the piezoelectric element 300, or a space in the vicinity of the piezoelectric element 300 can be appropriately detected and managed. Further, by sharing the process of forming the interlayer 215 with the process of forming the protective film 82, productivity of the liquid ejecting head 510b can be improved.

With the liquid ejecting head 510b of the present embodiment, the second detection electrode 212b includes the first electrode portion 212P1 extending along the first direction on the surface of the interlayer 215 and the plurality of second electrode portions 212P2 coupled to the first electrode portion 212P1 on the surface of the interlayer 215. The second electrode portions 212P2 extend in the second direction intersecting with the first direction and are arranged to be separated from each other. By forming the second detection electrode 212b in a comb shape with an area smaller than an area in a flat plate shape, an exposed area on the upper surface of the interlayer 215 can be increased, and thus inhibition of moisture absorption and dehumidification of the interlayer 215 by the second detection electrode 212b can be suppressed or prevented.

The liquid ejecting apparatus 500 of the present embodiment includes, in addition to the liquid ejecting head 510b, the humidity management section 250 that applies a predetermined detection voltage to the protective film 82 and the capacitance measurement section 242 that measures capacitance between the first detection electrode 211b and the second detection electrode 212b. With the liquid ejecting apparatus 500 of the present embodiment, by measuring the capacitance, information on humidity in the member in the liquid ejecting head 510 can be acquired.

With the liquid ejecting apparatus 500 of the present embodiment, the humidity management section 250 acquires a degree of moisture absorption of the protective film 82 by using the capacitance measured by the capacitance measurement section 242. With the liquid ejecting apparatus 500 of the present embodiment, the degree of moisture absorption of the protective film 82 changes according to humidity in the vicinity of the protective film 82, and thus information on humidity in the member in the liquid ejecting head 510 can be appropriately managed.

B2. Another Embodiment 1

Figure 13:
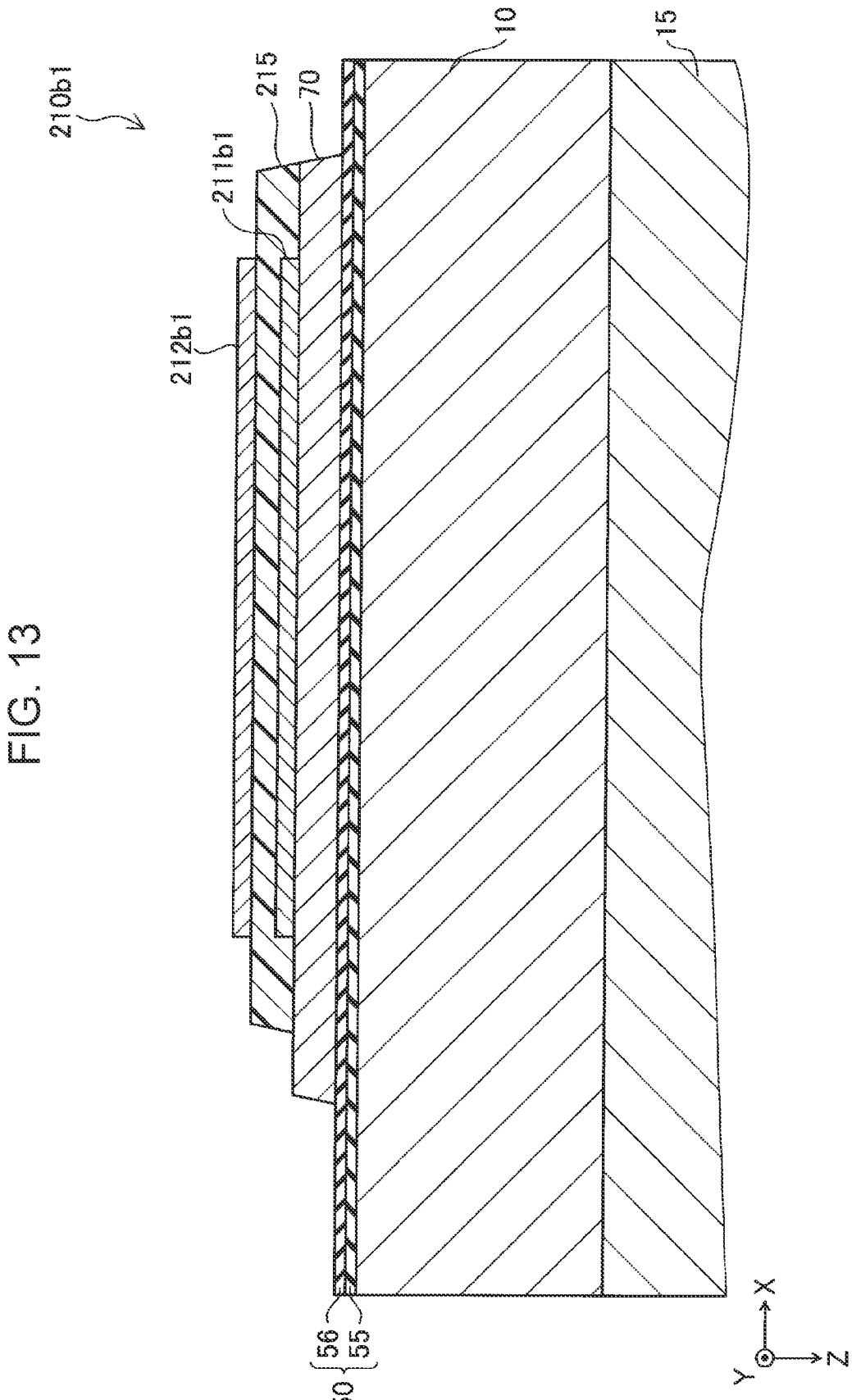
FIG. 13 is an explanatory diagram illustrating a humidity detection section included in a liquid ejecting head according to another embodiment.

FIG. 13 is an explanatory diagram illustrating the humidity detection section 210b1 included in the liquid ejecting head of another embodiment. The second embodiment describes an example in which the second detection electrode 212b has a comb shape. On the other hand, various shapes can be adopted for the first detection electrode and the second detection electrode. In the example of FIG. 13, both the first detection electrode 211b1 and the second detection electrode 212b1 are formed in a flat plate shape. In addition to the flat plate shape, the second detection electrode 212b1 may have, for example, a shape in which a certain number of through holes having a certain shape are provided in a comb shape. In addition to the comb shape, a so-called zigzag shape in which the conductor reciprocates a plurality of times may be adopted. Further, although not illustrated, the first detection electrode 211b1 may have a comb shape similar to the shape of the second detection electrode 212b1. For example, the first detection electrode 211b1 may have a shape in which a certain number of through holes having a certain shape are provided in a comb shape. In addition to the comb shape, a zigzag shape in which the conductor zigzags may be adopted.

C. Third Embodiment

Figure 14:
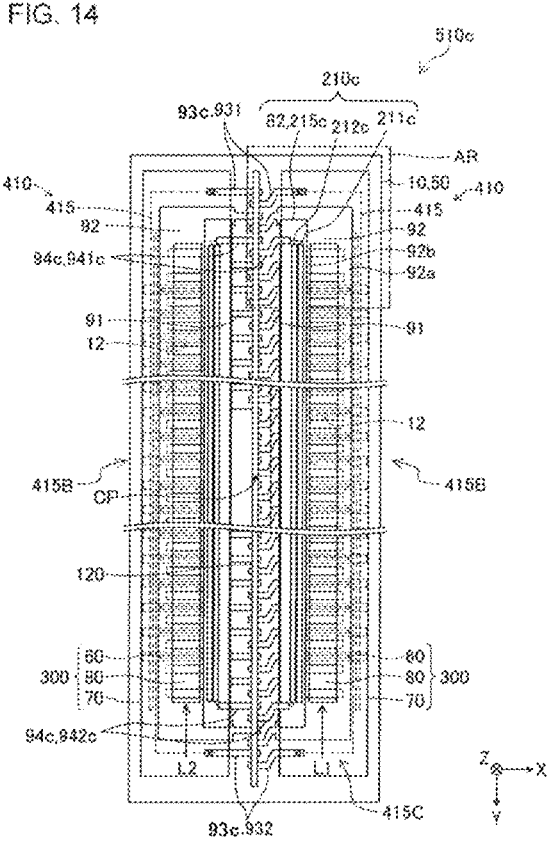
FIG. 14 is an explanatory diagram illustrating a configuration of a liquid ejecting head according to a third embodiment in plan view.

FIG. 14 is an explanatory diagram illustrating a configuration of a liquid ejecting head 510c according to a third embodiment in plan view. The liquid ejecting head 510c of the present embodiment is different from the liquid ejecting head 510 of the first embodiment in that the arrangement order of the first drive wiring 91, the second drive wiring 92, the temperature detection wiring 93c, and the humidity detection wiring 94c is different and the disposition position of the humidity detection section 210c is different, and other configurations are the same. As illustrated in FIG. 14, the humidity detection section 210c is provided on the protective film 82 disposed at the drive electrode end portion position overlapping the end portion 80b of the second drive electrode 80. That is, in the present embodiment, the protective film 82 disposed at the drive electrode end portion position functions as the interlayer 215c.

As illustrated in FIG. 14, the present embodiment is different from the first embodiment in that the first humidity detection wiring 941c and the second humidity detection wiring 942c are disposed between the first drive wiring 91 and the second drive wiring 92. The positions of the first humidity detection wiring 941c and the second humidity detection wiring 942c are disposed to be adjacent to both sides of the first drive wiring 91 so as to interpose the plurality of first drive wiring 91, the positions being positions which face each other with the first drive wiring 91 interposed therebetween and are disposed on the inner side of the liquid ejecting head 510c with respect to the second drive wiring 92.

Figure 15:
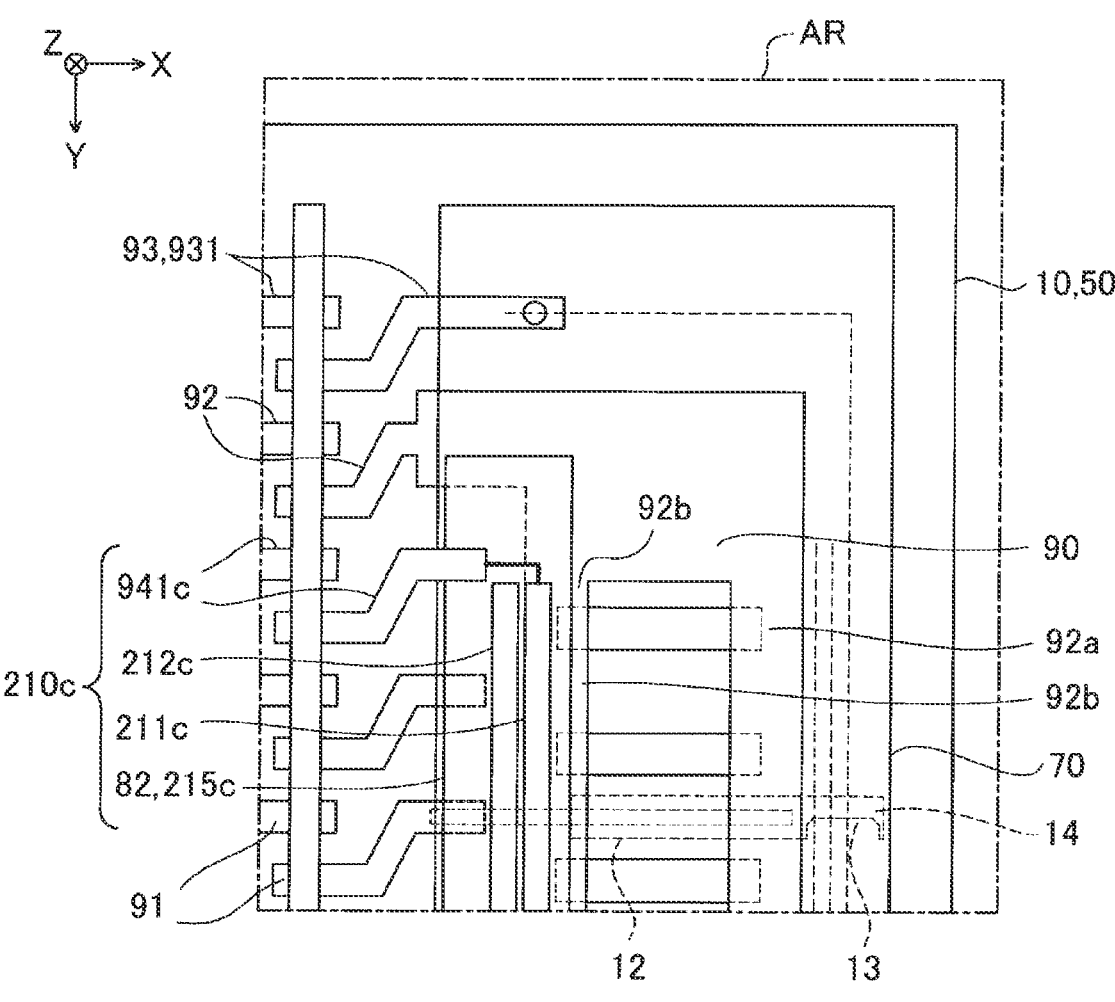
FIG. 15 is an enlarged explanatory diagram illustrating a partial range of FIG. 14.

FIG. 15 is an enlarged explanatory diagram illustrating a partial range AR of FIG. 14. As illustrated in FIG. 15, the first detection electrode 211c and the second detection electrode 212c are provided in the same layer on the upper surface of the protective film 82, and are disposed so as to face each other. Although detailed illustration of the shapes of the first detection electrode 211c and the second detection electrode 212c is omitted, any shape such as a linear shape, a flat plate shape, and a comb shape described above can be used.

With the liquid ejecting head 510c of the present embodiment, the protective film 82 is disposed at the drive electrode end portion position overlapping the first drive electrode 60 or the end portion 80b of the second drive electrode 80 in plan view of the liquid ejecting head 510c in the lamination direction. Therefore, the same effect as that of the first embodiment can be obtained, and the humidity detection section 210c can be easily disposed in the holding portion 31. Further, by using, as the interlayer 215c, the protective film 82 provided at the drive electrode end portion position, an increase in the number of components because of provision of the humidity detection section 210c can be suppressed.

D. Fourth Embodiment

Figure 16:
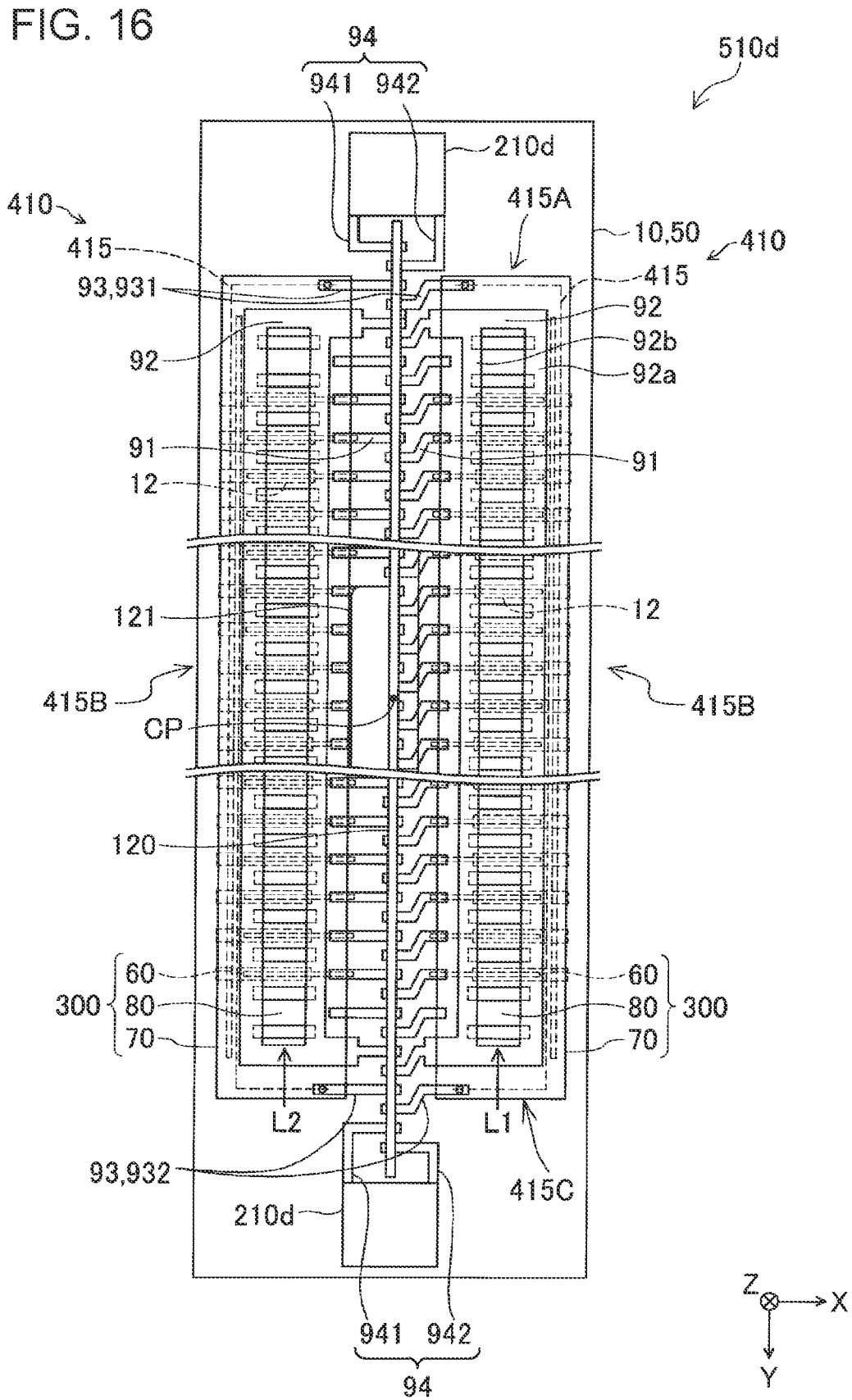
FIG. 16 is an explanatory diagram illustrating a configuration of a liquid ejecting head according to a fourth embodiment in plan view.

FIG. 16 is an explanatory diagram illustrating a configuration of a liquid ejecting head 510d according to a fourth embodiment in plan view. The first embodiment describes an example in which, in plan view, the humidity detection sections 210 are disposed at total four positions including positions adjacent to both sides of the first pressure chamber row L1 along the first arrangement direction and positions adjacent to both sides of the second pressure chamber row L2 along the second arrangement direction. On the other hand, as illustrated in FIG. 16, the humidity detection sections 210d may be disposed at positions adjacent to both sides of the wiring substrate 120 along the Y-axis direction which is the first arrangement direction. The humidity detection sections 210d may be disposed only at a position adjacent to any one side of the wiring substrate 120 along the Y-axis direction. The configuration of the humidity detection section 210d other than the disposition position is the same as the configuration of the humidity detection section 210 described in the first embodiment.

With the liquid ejecting head 510d configured as described above, the humidity detection section 210d can be disposed at a position separated from the piezoelectric element 300 as compared with when the humidity detection section is adjacent to each pressure chamber row. Thus, an influence of noise of the drive signal of the piezoelectric element 300 on the humidity detection section 210d can be reduced. When one holding portion 31 common to a plurality of pressure chamber rows such as the first pressure chamber row L1 and the second pressure chamber row L2 is provided, the number of the humidity detection sections 210 can be reduced, and thus information on humidity can be efficiently acquired.

E. Other Embodiments (E1) In the embodiments described above, an example in which the first detection electrode 211 and the second detection electrode 212 are formed of the same material as the material of the second drive electrode 80 is described. On the other hand, the first detection electrode 211 and the second detection electrode 212 may be formed of the same material as the material of the first drive electrode 60. By sharing the process of forming the first detection electrode 211 and the second detection electrode 212 with the process of forming the first drive electrode 60, productivity of the liquid ejecting head 510 can be improved. As an example of the process order in this case, after the interlayer 215 is formed using the same material as the material of the protective film 82, in the process of forming the first drive electrode 60, the first drive electrode 60 is formed and the first detection electrode 211 and the second detection electrode 212 are provided on the interlayer 215. In this case, the piezoelectric body 70 and the protective film 82 at the drive electrode end portion position are formed after the humidity detection section 210 is formed. In addition, only one of the first detection electrode 211 and the second detection electrode 212 may be formed of the same material as the material of the first drive electrode 60, and only one of the first detection electrode 211 and the second detection electrode 212 may be formed of the same material as the material of the second drive electrode 80. Further, one of the first detection electrode 211 and the second detection electrode 212 may be formed of the same material as the material of the first drive electrode 60, and the other of the first detection electrode 211 and the second detection electrode 212 may be formed of the same material as the material of the second drive electrode 80. Even in these cases, productivity of the liquid ejecting head 510 can be improved.

F. Other Aspects

The present disclosure is not limited to the above-described embodiments, and can be realized in various configurations without departing from the gist of the present disclosure. For example, technical features in the embodiments corresponding to technical features in respective aspects described in outline of the present disclosure can be appropriately replaced or combined in order to solve some or all of the above-described problems or achieve some or all of the above-described effects. Further, as long as the technical feature is not described as essential in the present specification, the technical feature can be appropriately deleted.

(1) According to one aspect of the present disclosure, a liquid ejecting head is provided. A liquid ejecting head includes: a piezoelectric element that includes a first drive electrode, a second drive electrode, and a piezoelectric body, the piezoelectric body being provided between the first drive electrode and the second drive electrode in a lamination direction in which the first drive electrode, the second drive electrode, and the piezoelectric body are laminated; a vibration plate that is provided on one side of the lamination direction with respect to the piezoelectric element and is deformed by driving of the piezoelectric element; a pressure chamber substrate that is provided on one side of the lamination direction with respect to the vibration plate and is provided with a plurality of pressure chambers; a protective film that is disposed on another side of the lamination direction with respect to the pressure chamber substrate, the other side of the lamination direction being an opposite side to the one side of the lamination direction; and detection electrodes that acquire information on humidity and include a first detection electrode in contact with the protective film and a second detection electrode in contact with the protective film at a position separated from the first detection electrode.

With the liquid ejecting head according to the aspect, by detecting the resistance or capacitance of the protective film between the first detection electrode and the second detection electrode, a degree of moisture absorption of the protective film among the component members of the liquid ejecting head can be detected with high accuracy. Therefore, information on humidity in the piezoelectric element, a member in the vicinity of the piezoelectric element, or a space in the vicinity of the piezoelectric element can be appropriately detected and managed.

(2) In the liquid ejecting head according to the aspect, the protective film may be formed of a resin material.

With the liquid ejecting head according to the aspect, by forming the protective film using a resin material of which the surface resistance is likely to change according to humidity, sensitivity of detection of the resistance of the protective film by the detection electrodes can be improved.

(3) In the liquid ejecting head according to the aspect, the protective film may be formed of an insulating material.

With the liquid ejecting head according to the aspect, a progress of migration between the conductor wirings disposed at a position at which the protective film is laminated can be suppressed or prevented.

(4) In the liquid ejecting head according to the aspect, the protective film may be formed of a material having a water vapor permeability lower than a water vapor permeability of the piezoelectric body.

With the liquid ejecting head according to the aspect, the member on which the protective film is laminated can be suitably protected from moisture in the air.

(5) In the liquid ejecting head according to the aspect, a Young's modulus of the protective film may be equal to or higher than 2 GPa.

With the liquid ejecting head according to the aspect, peeling from an end portion of the conductor wiring on which the protective film is laminated and occurrence of a physical damage such as a crack on the member on which the protective film is laminated can be suppressed.

(6) In the liquid ejecting head according to the aspect, in plan view of the liquid ejecting head in the lamination direction, the protective film may be disposed at a drive electrode end portion position overlapping an end portion of the first drive electrode or the second drive electrode.

With the liquid ejecting head according to the aspect, the protective film at the drive electrode end portion position can be used as a humidity detection target.

(7) In the liquid ejecting head according to the aspect, the first detection electrode and the second detection electrode may be disposed to be in contact with the protective film disposed at the drive electrode end portion position.

With the liquid ejecting head according to the aspect, an increase in the number of components can be suppressed by using the existing protective film at the drive electrode end portion position.

(8) In the liquid ejecting head according to the aspect, the first detection electrode and the second detection electrode may be disposed in the same layer on the one side or the other side of the lamination direction with respect to the protective film.

With the liquid ejecting head according to the aspect, the process of forming the first detection electrode and the process of forming the second detection electrode can be easily shared.

(9) In the liquid ejecting head according to the aspect, the second detection electrode may include a first electrode portion that extends along a first direction on a surface of the protective film and a plurality of second electrode portions that are coupled to the first electrode portion on the surface of the protective film, the plurality of second electrode portions extending in a second direction intersecting with the first direction and arranged to be separated from each other. The first detection electrode may include a third electrode portion that extends along a third direction on the surface of the protective film and a plurality of fourth electrode portions that are coupled to the third electrode portion on the surface of the protective film, the plurality of fourth electrode portions extending in a fourth direction intersecting with the third direction and arranged to be separated from each other. The plurality of second electrode portions and the plurality of fourth electrode portions may be alternately arranged.

With the liquid ejecting head according to the aspect, accuracy of detection of the resistance of the first detection electrode and the second detection electrode can be improved, and thus insulation deterioration because of ion migration or the like can be suitably evaluated.

(10) According to another aspect of the present disclosure, there is provided a liquid ejecting apparatus. A liquid ejecting apparatus includes: the liquid ejecting head according to any one of (6) to (9); a humidity management section that applies a predetermined detection voltage to the protective film interposed between the first detection electrode and the second detection electrode; and a resistance measurement section that measures resistance between the first detection electrode and the second detection electrode.

With the liquid ejecting apparatus according to the aspect, information on humidity in the member in the liquid ejecting head can be appropriately managed.

(11) In the liquid ejecting apparatus according to the aspect, the humidity management section may acquire information on humidity by using the resistance measured by the resistance measurement section.

With the liquid ejecting apparatus according to the aspect, information on humidity in the member in the liquid ejecting head can be appropriately managed.

(12) In the liquid ejecting head according to the aspect, the first detection electrode may be disposed on the one side of the lamination direction with respect to the protective film. The second detection electrode may be disposed on the other side of the lamination direction with respect to the protective film.

With the liquid ejecting head according to the aspect, the capacitance between the first detection electrode and the second detection electrode can be measured, and thus information on humidity can be detected with high accuracy.

(13) In the liquid ejecting head according to the aspect, the second detection electrode may include a first electrode portion that extends along a first direction on a surface of the protective film and a plurality of second electrode portions that are coupled to the first electrode portion on the surface of the protective film, the plurality of second electrode portions extending in a direction intersecting with the first direction and arranged to be separated from each other.

With the liquid ejecting head according to the aspect, by forming the second detection electrode with an area smaller than an area of the flat plate, an exposed area of the upper surface of the protective film can be increased, and thus inhibition of moisture absorption of the protective film by the second detection electrode can be suppressed or prevented.

(14) According to another aspect of the present disclosure, there is provided a liquid ejecting apparatus. A liquid ejecting apparatus includes: the liquid ejecting head according to (12) or (13); a humidity management section that applies a predetermined detection voltage to the protective film interposed between the first detection electrode and the second detection electrode; and a capacitance measurement section that measures capacitance between the first detection electrode and the second detection electrode.

With the liquid ejecting apparatus according to the aspect, by measuring the capacitance, information on humidity in the member in the liquid ejecting head can be acquired.

(15) In the liquid ejecting apparatus according to the aspect, the humidity management section may acquire information on humidity by using the capacitance measured by the capacitance measurement section.

With the liquid ejecting apparatus according to the aspect, information on humidity in the member in the liquid ejecting head can be appropriately managed.

(16) In the liquid ejecting head according to the aspect, at least one of the first detection electrode and the second detection electrode may be formed of the same material as a material of the first drive electrode.

With the liquid ejecting head according to the aspect, the process of forming the first detection electrode and the second detection electrode can be shared with the process of forming the first drive electrode, and thus productivity of the liquid ejecting head can be improved.

(17) In the liquid ejecting head according to the aspect, at least one of the first detection electrode and the second detection electrode may be formed of the same material as a material of the second drive electrode.

With the liquid ejecting head according to the aspect, the process of forming the first detection electrode and the second detection electrode can be shared with the process of forming the second drive electrode, and thus productivity of the liquid ejecting head can be improved.

(18) In the liquid ejecting head according to the aspect, in plan view of the liquid ejecting head in the lamination direction, the plurality of pressure chambers may be arranged in a first pressure chamber row along a first arrangement direction and in a second pressure chamber row along a second arrangement direction parallel to the first arrangement direction. The protective film, the first detection electrode, and the second detection electrode may be disposed on the pressure chamber substrate at at least one position of positions adjacent to the first pressure chamber row along the first arrangement direction and positions adjacent to the second pressure chamber row along the second arrangement direction.

With the liquid ejecting head according to the aspect, by individually providing the humidity detection sections for each of the first pressure chamber row and the second pressure chamber row, information on humidity for each pressure chamber row can be acquired with high accuracy.

(19) In the liquid ejecting head according to the aspect, in plan view of the liquid ejecting head in the lamination direction, the plurality of pressure chambers may be arranged in a first pressure chamber row along a first arrangement direction and in a second pressure chamber row along a second arrangement direction parallel to the first arrangement direction. A wiring substrate that is electrically coupled to the liquid ejecting head may be disposed between the first pressure chamber row and the second pressure chamber row. The protective film, the first detection electrode, and the second detection electrode may be disposed on the pressure chamber substrate at positions adjacent to the wiring substrate along the first arrangement direction.

With the liquid ejecting head according to the aspect, the protective film, the first detection electrode, and the second detection electrode can be disposed at a position away from the piezoelectric element, and thus an influence of noise of the drive signal of the piezoelectric element on humidity detection can be reduced.

The present disclosure can also be realized in various aspects other than the liquid ejecting apparatus and the liquid ejecting head. For example, the present disclosure can be realized in aspects of a method for manufacturing a liquid ejecting head, a method for manufacturing a liquid ejecting apparatus, or the like.

The present disclosure is not limited to an ink jet method, and can be applied to any liquid ejecting apparatuses that ejects a liquid other than ink and a liquid ejecting head that is used in the liquid ejecting apparatuses. For example, the present disclosure can be applied to the following various liquid ejecting apparatuses and liquid ejecting heads thereof.

(1) An image recording apparatus such as a facsimile apparatus.

(2) A color material ejecting apparatus used for manufacturing a color filter for an image display apparatus such as a liquid crystal display.

(3) An electrode material ejecting apparatus used for forming electrodes of an organic Electro Luminescence (EL) display, a Field Emission Display (FED), or the like.

(4) A liquid ejecting apparatus that ejects a liquid containing a bioorganic substance used for manufacturing a biochip.

(5) A sample ejecting apparatus as a precision pipette.

(6) A lubricating oil ejecting apparatus.

(7) A resin liquid ejecting apparatus.

(8) A liquid ejecting apparatus that ejects lubricating oil with pinpoint to a precision machine such as a watch or a camera.

(9) A liquid ejecting apparatus that ejects a transparent resin liquid, such as an ultraviolet curable resin liquid, onto a substrate in order to form a micro hemispherical lens (optical lens) or the like used for an optical communication element or the like.

(10) A liquid ejecting apparatus that ejects an acidic or alkaline etching liquid for etching a substrate or the like.

(11) A liquid ejecting apparatus including a liquid consumption head that ejects any other minute amount of droplets.

Further, the "liquid" may be any material that can be consumed by the liquid ejecting apparatus. For example, the "liquid" may be a material in a state when a substance is liquefied, and the "liquid" includes a liquid state material with high or low viscosity and a liquid state material, such as a sol, gel water, other inorganic solvent, organic solvent, solution, liquid resin, and liquid metal (metal melt). Further, the "liquid" includes not only a liquid as a state of a substance but also a liquid in which particles of a functional material made of a solid substance, such as a pigment or a metal particle, are dissolved, dispersed, or mixed in a solvent. Further, the following is mentioned as a typical example of a liquid.

(1) Adhesive main agent and curing agent.

(2) Paint-based paints and diluents, clear paints and diluents.

(3) Main solvent and diluting solvent containing cells of ink for cells.

(4) Metallic leaf pigment dispersion liquid and diluting solvent of ink (metallic ink) that develops metallic luster.

(5) Gasoline/diesel and biofuel for vehicle fuel.

(6) Main ingredients and protective ingredients of medicine.

(7) Light Emitting Diode (LED) fluorescent material and encapsulant.

What is claimed is:

1. A liquid ejecting head comprising:

a piezoelectric element that includes a first drive electrode, a second drive electrode, and a piezoelectric body, the piezoelectric body being provided between the first drive electrode and the second drive electrode in a lamination direction in which the first drive electrode, the second drive electrode, and the piezoelectric body are laminated;

a vibration plate that is provided on a first side of the lamination direction with respect to the piezoelectric element and is deformed by driving of the piezoelectric element;

a pressure chamber substrate that is provided on the first side of the lamination direction with respect to the vibration plate and is provided with a plurality of pressure chambers;

a protective film that is disposed on a second side of the lamination direction with respect to the pressure chamber substrate and disposed on the piezoelectric body, the second side of the lamination direction being an opposite side to the first side of the lamination direction; and detection electrodes that include a first detection electrode in contact with the protective film and a second detection electrode in contact with the protective film at a position separated from the first detection electrode.

2. The liquid ejecting head according to claim 1, wherein the protective film is formed of a resin material.

3. The liquid ejecting head according to claim 1, wherein the protective film is formed of an insulating material.

4. The liquid ejecting head according to claim 1, wherein the protective film is formed of a material having a water vapor permeability lower than a water vapor permeability of the piezoelectric body.

5. The liquid ejecting head according to claim 1, wherein a Young's modulus of the protective film is equal to or higher than 2 GPa.

6. The liquid ejecting head according to claim 1, wherein in plan view of the liquid ejecting head in the lamination direction, the protective film is disposed at a drive electrode end portion position overlapping an end portion of the first drive electrode or the second drive electrode.

7. The liquid ejecting head according to claim 6, wherein the first detection electrode and the second detection electrode are disposed to be in contact with the protective film disposed at the drive electrode end portion position.

8. A liquid ejecting apparatus comprising:
the liquid ejecting head according to claim 6;

a humidity management section that applies a predetermined detection voltage to the protective film interposed between the first detection electrode and the second detection electrode; and a resistance measurement section that measures resistance between the first detection electrode and the second detection electrode.

9. The liquid ejecting apparatus according to claim 8, wherein
the humidity management section acquires information on humidity by using the resistance measured by the resistance measurement section.

10. The liquid ejecting head according to claim 1, wherein the first detection electrode and the second detection electrode are disposed in the same layer on the first side or the second side of the lamination direction with respect to the protective film.

11. The liquid ejecting head according to claim 10, wherein
the second detection electrode includes a first electrode portion that extends along a first direction on a surface of the protective film and a plurality of second electrode portions that are coupled to the first electrode portion on the surface of the protective film, the plurality of second electrode portions extending in a second direction intersecting with the first direction and arranged to be separated from each other, the first detection electrode includes a third electrode portion that extends along a third direction on the surface of the protective film and a plurality of fourth electrode portions that are coupled to the third electrode portion on the surface of the protective film, the plurality of fourth electrode portions extending in a fourth direction intersecting with the third direction and arranged to be separated from each other, and the plurality of second electrode portions and the plurality of fourth electrode portions are alternately arranged.

12. The liquid ejecting head according to claim 1, wherein at least one of the first detection electrode and the second detection electrode is formed of the same material as a material of the first drive electrode.

13. The liquid ejecting head according to claim 1, wherein at least one of the first detection electrode and the second detection electrode is formed of the same material as a material of the second drive electrode.

14. The liquid ejecting head according to claim 1, wherein in plan view of the liquid ejecting head in the lamination direction, the plurality of pressure chambers are arranged in a first pressure chamber row along a first arrangement direction and in a second pressure chamber row along a second arrangement direction parallel to the first arrangement direction, and the protective film, the first detection electrode, and the second detection electrode are disposed on the pressure chamber substrate at at least one position of positions adjacent to the first pressure chamber row along the first arrangement direction and positions adjacent to the second pressure chamber row along the second arrangement direction.

15. A liquid ejecting head comprising:
a piezoelectric element that includes a first drive electrode, a second drive electrode, and a piezoelectric body, the piezoelectric body being provided between the first drive electrode and the second drive electrode in a lamination direction in which the first drive electrode, the second drive electrode, and the piezoelectric body are laminated;

a vibration plate that is provided on a first side of the lamination direction with respect to the piezoelectric element and is deformed by driving of the piezoelectric element;

a pressure chamber substrate that is provided on the first side of the lamination direction with respect to the vibration plate and is provided with a plurality of pressure chambers;

a protective film that is disposed on a second side of the lamination direction with respect to the pressure chamber substrate and disposed on the piezoelectric body, the second side of the lamination direction being an opposite side to the first side of the lamination direction; and detection electrodes that include a first detection electrode in contact with the protective film and a second detection electrode in contact with the protective film at a position separated from the first detection electrode, wherein the first detection electrode is disposed on the first side of the lamination direction with respect to the protective film, and the second detection electrode is disposed on the second side of the lamination direction with respect to the protective film.

16. The liquid ejecting head according to claim 15, wherein the second detection electrode includes a first electrode portion that extends along a first direction on a surface of the protective film and a plurality of second electrode portions that are coupled to the first electrode portion on the surface of the protective film, the plurality of second electrode portions extending in a direction intersecting with the first direction and arranged to be separated from each other.

17. A liquid ejecting apparatus comprising:

the liquid ejecting head according to claim 15;

a humidity management section that applies a predetermined detection voltage to the protective film interposed between the first detection electrode and the second detection electrode; and a capacitance measurement section that measures capacitance between the first detection electrode and the second detection electrode.

18. The liquid ejecting apparatus according to claim 17, wherein the humidity management section acquires information on humidity by using the capacitance measured by the capacitance measurement section.

19. A liquid ejecting head comprising:

a piezoelectric element that includes a first drive electrode, a second drive electrode, and a piezoelectric body, the piezoelectric body being provided between the first drive electrode and the second drive electrode in a lamination direction in which the first drive electrode, the second drive electrode, and the piezoelectric body are laminated;

a vibration plate that is provided on a first side of the lamination direction with respect to the piezoelectric element and is deformed by driving of the piezoelectric element;

a pressure chamber substrate that is provided on the first side of the lamination direction with respect to the vibration plate and is provided with a plurality of pressure chambers;

a protective film that is disposed on a second side of the lamination direction with respect to the pressure chamber substrate and disposed on the piezoelectric body, the second side of the lamination direction being an opposite side to the first side of the lamination direction; and detection electrodes that include a first detection electrode in contact with the protective film and a second detection electrode in contact with the protective film at a position separated from the first detection electrode, wherein in plan view of the liquid ejecting head in the lamination direction, the plurality of pressure chambers are arranged in a first pressure chamber row along a first arrangement direction and in a second pressure chamber row along a second arrangement direction parallel to the first arrangement direction, a wiring substrate that is electrically coupled to the liquid ejecting head is disposed between the first pressure chamber row and the second pressure chamber row, and the protective film, the first detection electrode, and the second detection electrode are disposed on the pressure chamber substrate at positions adjacent to the wiring substrate along the first arrangement direction.

* * * * *